United States Patent
Yonehara et al.

(10) Patent No.: US 9,583,736 B2
(45) Date of Patent: Feb. 28, 2017

(54) ORGANIC ELECTROLUMINESCENT ELEMENT AND LIGHT EMITTING DEVICE WITH GAP FILLED WITH GAS

(71) Applicant: KABUSHIKI KAISHA TOSHIBA, Minato-ku (JP)

(72) Inventors: Toshiya Yonehara, Fukuoka (JP); Tomio Ono, Yokohama (JP); Tomoaki Sawabe, Sumida (JP); Shintaro Enomoto, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/640,970

(22) Filed: Mar. 6, 2015

(65) Prior Publication Data
US 2015/0188090 A1 Jul. 2, 2015

(30) Foreign Application Priority Data
Sep. 20, 2012 (JP) .................................. 2012-207600

(51) Int. Cl.
*H01L 51/52* (2006.01)
*G02F 1/137* (2006.01)

(52) U.S. Cl.
CPC .......... *H01L 51/5268* (2013.01); *G02F 1/137* (2013.01); *H01L 51/524* (2013.01);
(Continued)

(58) Field of Classification Search
CPC ............. H01L 51/5275; H01L 51/5268; H01L 51/5271; H01L 51/5234
See application file for complete search history.

(56) References Cited

U.S. PATENT DOCUMENTS 7,030,556 B2 * 4/2006 Adachi ............... H01L 27/3246
313/110
8,698,390 B2 4/2014 Yonehara et al.
(Continued)

FOREIGN PATENT DOCUMENTS

EP 1 406 474 A1 4/2004
JP 2006-092936 A 4/2006
(Continued)

OTHER PUBLICATIONS

English translation of the International Preliminary Report on Patentability and Written Opinion issued on Apr. 2, 2015 in PCT/JP2013/005520.
(Continued)

*Primary Examiner* — John P Dulka
(74) *Attorney, Agent, or Firm* — Oblon, McClelland, Maier & Neustadt, L.L.P.

(57) ABSTRACT

According to one embodiment, an organic electroluminescent element includes a first electrode, a reflective layer, an organic light emitting layer, a second electrode, and an optical buffer layer. The reflective layer is provided to face the first electrode. The organic light emitting layer is provided between the first electrode and the reflective layer. The second electrode is provided between the organic light emitting layer and the reflective layer. The optical buffer layer is provided between the second electrode and the reflective layer. The refractive index of the optical buffer layer is lower than a refractive index of the organic light emitting layer. The optical buffer layer includes a gas filled between the second electrode and the reflective layer.

19 Claims, 22 Drawing Sheets

(52) U.S. Cl.
CPC ...... H01L 51/5218 (2013.01); H01L 51/5221 (2013.01); H01L 51/5234 (2013.01); H01L 51/5271 (2013.01); H01L 51/5275 (2013.01)

(56) References Cited

U.S. PATENT DOCUMENTS

| | | | |
|---|---|---|---|
| 8,884,278 | B2 | 11/2014 | Yonehara et al. |
| 2005/0007518 | A1 | 1/2005 | Kato |
| 2006/0108580 | A1 | 5/2006 | Yoshida et al. |
| 2007/0222372 | A1* | 9/2007 | Cok ................ H01L 51/5268 313/504 |
| 2008/0297045 | A1* | 12/2008 | Cok .................... B82Y 20/00 313/506 |
| 2010/0123152 | A1 | 5/2010 | Sugisawa |
| 2012/0181920 | A1 | 7/2012 | Frischeisen et al. |

FOREIGN PATENT DOCUMENTS

| | | | | |
|---|---|---|---|---|
| JP | EP 1734792 A1 * | 12/2006 | ......... | H01L 51/5206 |
| TW | 200415957 | 8/2004 | | |
| TW | 200420192 A | 10/2004 | | |
| TW | I284492 | 7/2007 | | |
| TW | 201230434 A1 | 7/2012 | | |
| WO | WO 2006/016153 A1 | 2/2006 | | |

OTHER PUBLICATIONS

International Search Report issued Sep. 1, 2014 in PCT/JP2013/005520 filed on Sep. 18, 2013 in English Language.
Written Opinion issued Sep. 1, 2014 in PCT/JP2013/005520 filed on Sep. 18, 2013 in English Language.
Mikami, A., et al, "Optical Design of Enhanced Light Extraction Efficiency in Multi-Stacked OLEDs Coupled with High Refractive-Index Medium and Back-Cavity Structure," *SID 2012 Digest 51.1*, pp. 683-686.
Goto, T., et al., "Optical Analysis of Surface-Plasmon Loss in OLED with Multi-Cathode Structure," *Society of Applied Physics*, 59 ed., 2012, p. 12-277.
Combined Taiwanese Office Action and Search Report issued Jul. 23, 2015 in Patent Application No. 102133879 (with English language translation).
Office Action issued Dec. 30, 2015 in Taiwanese Patent Application No. 102133879 (with English translation).

* cited by examiner

DISTANCE BETWEEN LIGHT EMISSION
POSITION AND SECOND ELECTRODE 120 (nm)

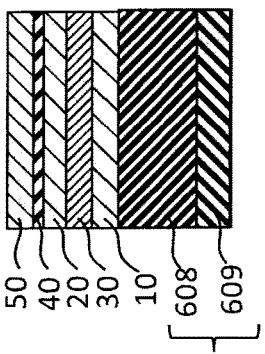
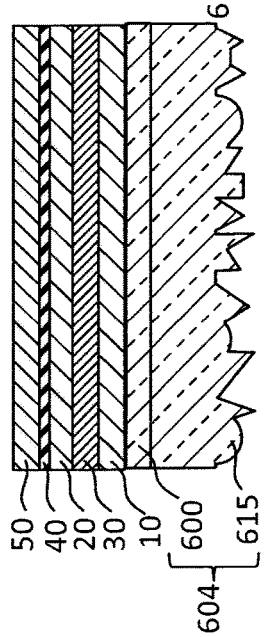
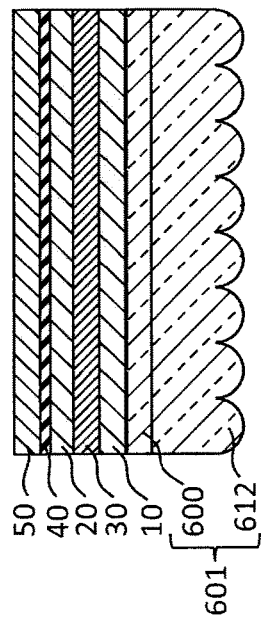
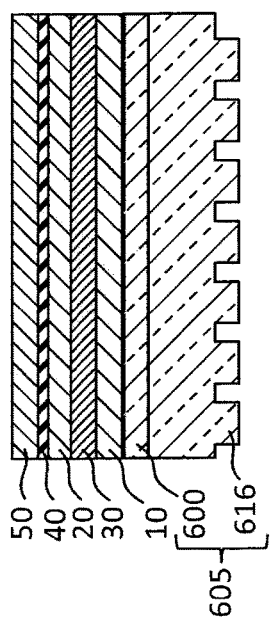
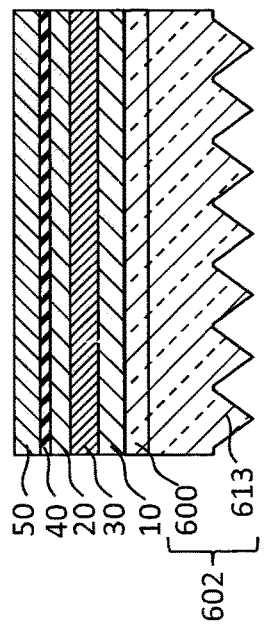
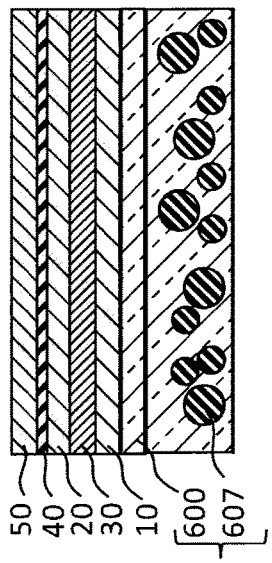
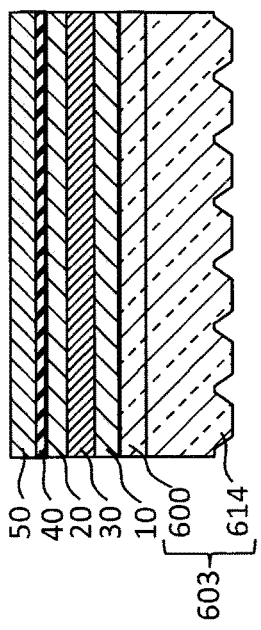

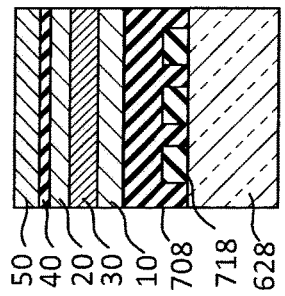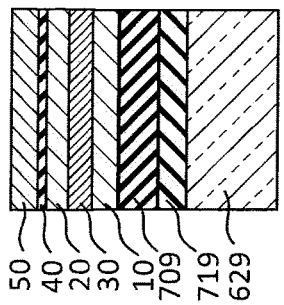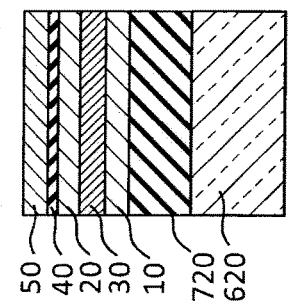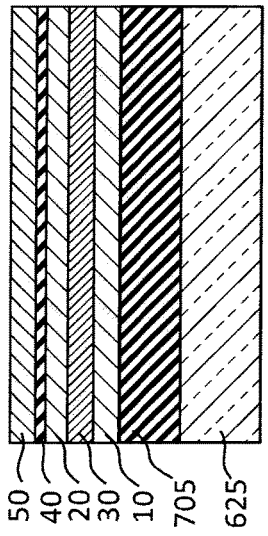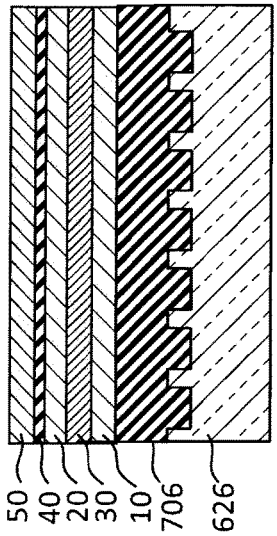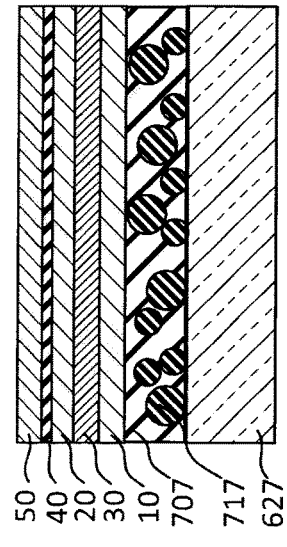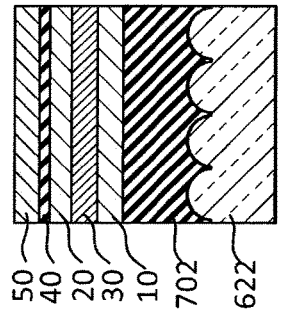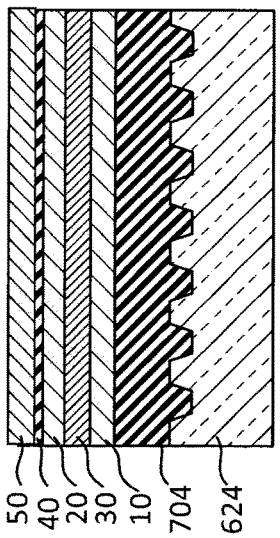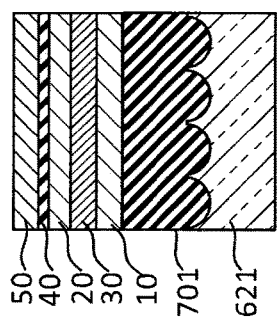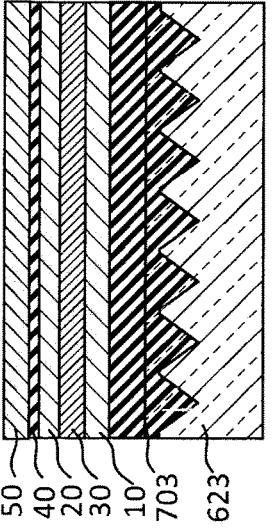

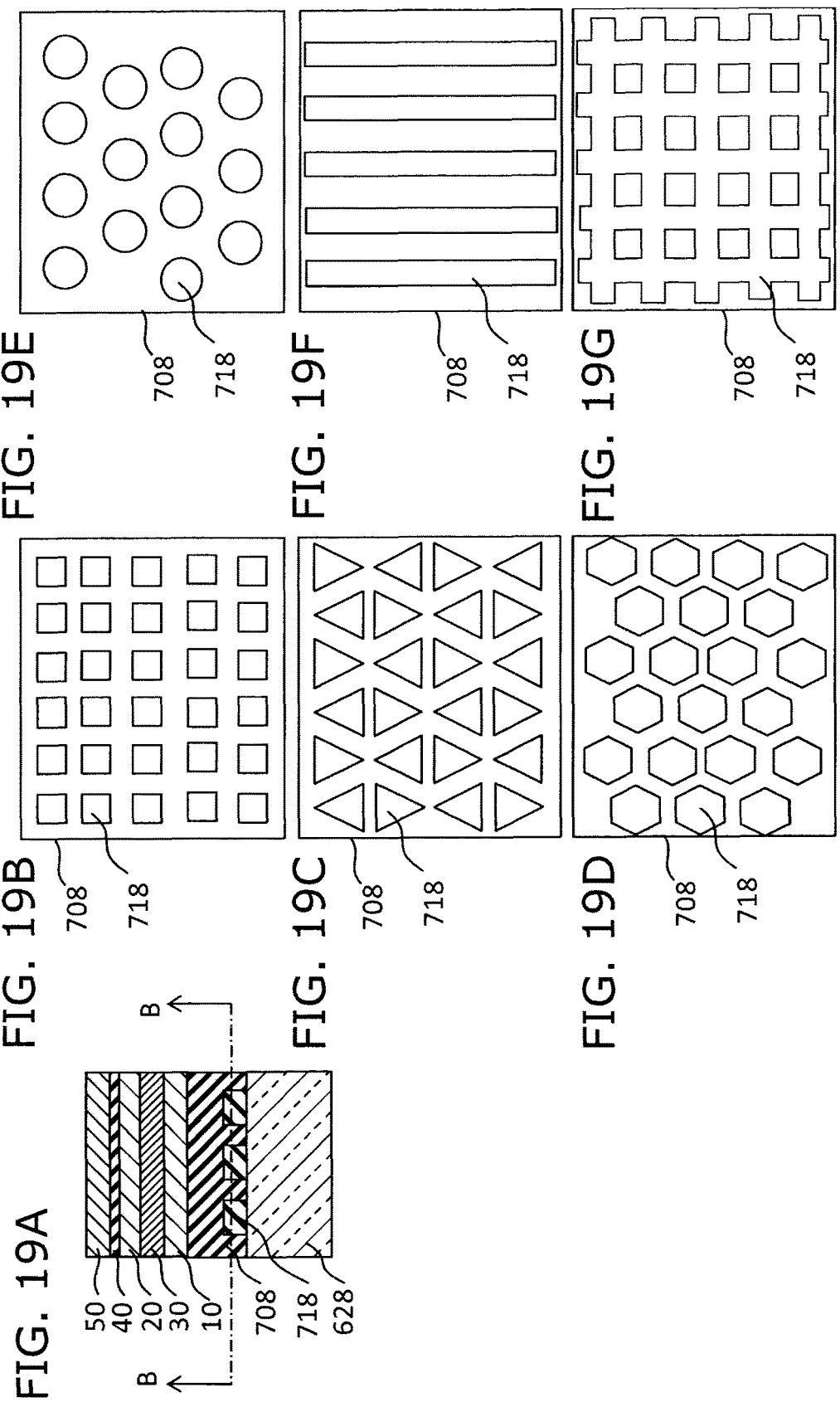

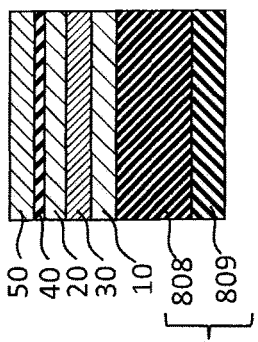
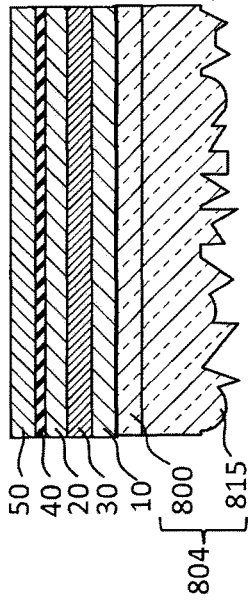
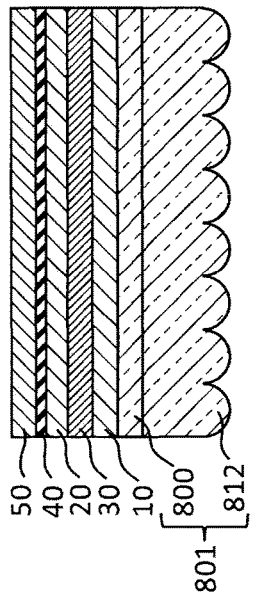
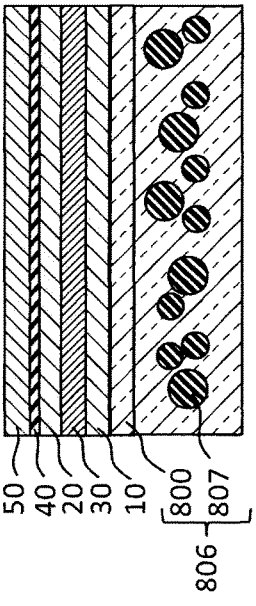
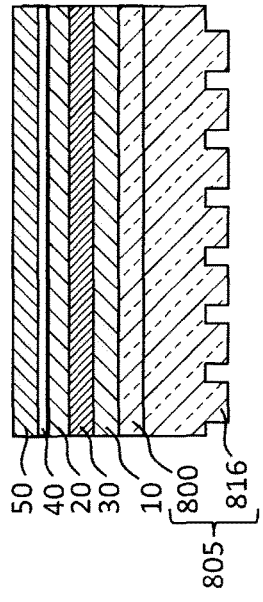
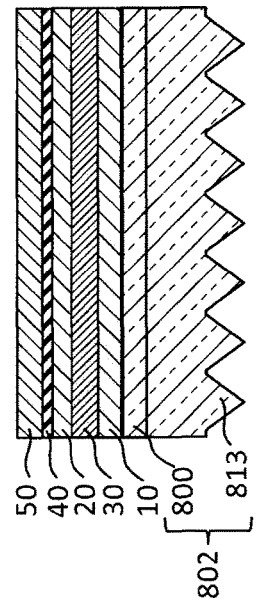
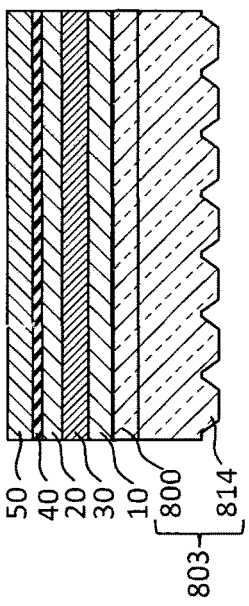

ORGANIC ELECTROLUMINESCENT ELEMENT AND LIGHT EMITTING DEVICE WITH GAP FILLED WITH GAS

CROSS-REFERENCE TO RELATED APPLICATIONS

This application is based upon and claims the benefit of priority from Japanese Patent Application No. 2012-207600, filed on Sep. 20, 2012, and PCT Patent Application PCT/JP2013/005520, filed on Sep. 18, 2013; the entire contents of which are incorporated herein by reference.

FIELD

Embodiments described herein relate generally to an organic electroluminescent element and a light emitting device.

BACKGROUND

An organic electroluminescent element includes a cathode-side electrode, an anode-side electrode, and an organic light emitting layer provided between the cathode-side electrode and the anode-side electrode.

By applying a voltage between the cathode-side electrode and the anode-side electrode in the organic electroluminescent element, electrons are injected from the cathode-side electrode into the organic light emitting layer; and holes are injected from the anode-side electrode into the organic light emitting layer. The electrons and the holes that are injected recombine; and light is produced by radiative deactivation of excitons generated by the recombination.

It is desirable to increase the light extraction efficiency of such an organic electroluminescent element.

BRIEF DESCRIPTION OF THE DRAWINGS

FIGS. 16A to 16G are schematic views illustrating organic electroluminescent elements according to variations of the seventh embodiment;

FIGS. 17A to 17J are schematic views illustrating organic electroluminescent elements according to an eighth embodiment;

FIGS. 19A to 19G are schematic views illustrating cross-section of FIG. 17A;

FIGS. 21A to 21G are schematic views illustrating organic electroluminescent element according to variations of the ninth embodiment.

DETAILED DESCRIPTION

Figure 1A:
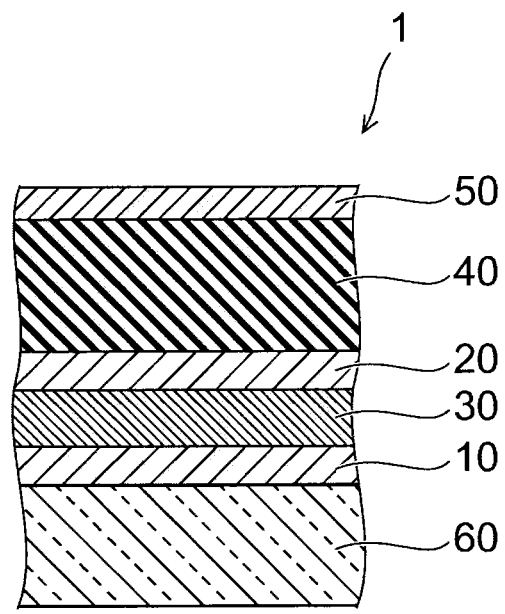
FIGS. 1A and 1B are schematic views illustrating organic electroluminescent elements according to a first embodiment.

According to one embodiment, an organic electroluminescent element includes a first electrode, a reflective layer, an organic light emitting layer, a second electrode, and an optical buffer layer. The reflective layer is provided to face the first electrode. The organic light emitting layer is provided between the first electrode and the reflective layer. The second electrode is provided between the organic light emitting layer and the reflective layer. The optical buffer layer is provided between the second electrode and the reflective layer. The refractive index of the optical buffer layer is lower than a refractive index of the organic light emitting layer. The optical buffer layer includes a gas filled between the second electrode and the reflective layer.

Various embodiments will be described hereinafter with reference to the accompanying drawings.

The drawings are schematic or conceptual; and the relationships between the thicknesses and the widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
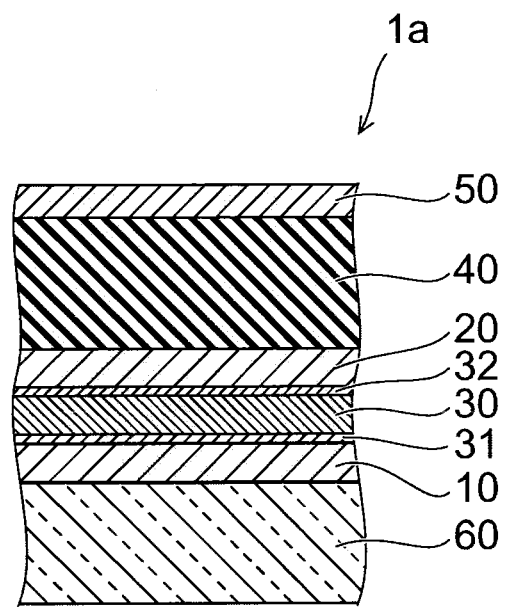

FIGS. 1A and 1B are schematic views illustrating organic electroluminescent elements according to a first embodiment.

FIG. 1A is a schematic cross-sectional view of an organic electroluminescent element 1. FIG. 1B is a schematic cross-sectional view of an organic electroluminescent element 1a that further includes a first functional layer 31 and a second functional layer 32.

As shown in FIG. 1A, the organic electroluminescent element 1 includes a first electrode 10, a second electrode 20, an organic light emitting layer 30, an optical buffer layer 40, and a reflective layer 50.

The first electrode 10 is transmissive to light emitted from the organic light emitting layer 30.

The first electrode 10 functions as, for example, an anode. The thickness dimension of the first electrode 10 may be, for example, not less than 50 nanometers (nm).

The first electrode 10 includes, for example, an oxide including at least one element species selected from the group consisting of In, Sn, Zn, and Ti. The first electrode 10 is, for example, an ITO (Indium Tin Oxide) film.

The second electrode 20 is provided between the organic light emitting layer 30 and the reflective layer 50. The second electrode 20 is transmissive to the light emitted from the organic light emitting layer 30.

The second electrode 20 functions as, for example, a cathode. The thickness dimension of the second electrode 20 may be, for example, not more than 10 nanometers (nm).

It is also possible for the first electrode 10 to be the cathode and the second electrode 20 to be the anode.

The second electrode 20 may include a material having a low refractive index and a low extinction coefficient. For example, the second electrode 20 may include at least one species selected from the group consisting of Ag, Au, Ca, and an alkaline metal.

For example, the second electrode 20 may be made of a magnesium-silver alloy in which the volume fraction of Ag is not less than 0.2.

Details relating to the material included in the second electrode 20, etc., are described below.

The organic light emitting layer 30 is provided between the first electrode 10 and the second electrode 20. The organic light emitting layer 30 emits light having a component of a wavelength of visible light. The thickness dimension of the organic light emitting layer 30 may be, for example, not less than 50 nanometers (nm).

The organic light emitting layer 30 includes, for example, Alq$_3$, F8BT, PPV, etc. The organic light emitting layer 30 may include a mixed material of a host material and a dopant added to the host material. For example, CBP, BCP, TPD, PVK, PPT, etc., may be used as the host material. For example, FIrpic, Ir(ppy)$_3$, FIr$_6$, Ir(MDQ)$_2$(acac), and Ir(piq)$_3$ etc., may be used as the dopant material.

As shown in FIG. 1B, the organic electroluminescent element 1a may further include the first functional layer 31 and the second functional layer 32.

The first functional layer 31 is provided between the organic light emitting layer 30 and the first electrode 10. The thickness dimension of the first functional layer 31 may be, for example, about 10 nanometers (nm). The first functional layer 31 may be provided if necessary.

The first functional layer 31 may function as, for example, a hole injection layer. In the case where the first functional layer 31 functions as the hole injection layer, the first functional layer 31 includes, for example, PEDPOT:PPS, CuPc, MoO$_3$, etc.

The first functional layer 31 may function as, for example, a hole transport layer. In the case where the first functional layer 31 functions as the hole transport layer, the first functional layer 31 includes, for example, α-NPD, TAPC, m-MTDATA, TPD, TCTA, etc.

The first functional layer 31 may include a layer that functions as a hole injection layer stacked with a layer that functions as a hole transport layer. In such a case, the layer that functions as the hole injection layer is a layer to improve the injection characteristics of the holes. The layer that functions as the hole injection layer is provided between the first electrode 10 and the layer that functions as the hole transport layer.

The second functional layer 32 is provided between the organic light emitting layer 30 and the second electrode 20. The thickness dimension of the second functional layer 32 may be, for example, about 10 nanometers (nm). The second functional layer 32 may be provided if necessary.

The second functional layer 32 functions as, for example, an electron transport layer. The second functional layer 32 includes, for example, Alq$_3$, BAlq, POPy$_2$, Bphen, 3TPYMB, etc.

The second functional layer 32 may include a layer that functions as an electron transport layer stacked with a layer that functions as an electron injection layer. In such a case, the layer that functions as the electron injection layer is a layer to improve the injection characteristics of the electrons. The layer that functions as the electron injection layer is provided between the second electrode 20 and the layer that functions as the electron transport layer.

The optical buffer layer 40 is provided between the second electrode 20 and the reflective layer 50. Therefore, the distance between the organic light emitting layer 30 and the reflective layer 50 can be at least the thickness dimension of the optical buffer layer 40. Therefore, the plasmon loss described below can be reduced.

The thickness dimension of the optical buffer layer 40 may be 50 nanometers (nm) or more.

The refractive index of the optical buffer layer 40 is lower than the refractive index of the organic light emitting layer 30.

The optical buffer layer 40 may include, for example, SiO$_2$ (silicon oxide), LiF (lithium fluoride), CaF$_2$ (calcium fluoride), MgF$_2$ (magnesium fluoride), a sealing member made of a resin material such as an epoxy resin and the like, a fluorinated unsaturated hydrocarbon such as a perfluoroalkane, etc.

Details relating to the decrease of the plasmon loss, the refractive index of the optical buffer layer 40, and the thickness dimension of the optical buffer layer 40 are described below.

The reflective layer 50 is provided on the side of the optical buffer layer 40 opposite to the side on which the second electrode 20 is provided. In other words, the reflective layer 50 is provided to face the first electrode 10. The reflective layer 50 is reflective to the light emitted from the organic light emitting layer 30. The thickness dimension of the reflective layer 50 may be, for example, about 100 nanometers (nm).

The reflective layer 50 may include, for example, a metal such as Ag, Mg:Ag (magnesium-silver alloy), Al, etc. The reflective layer 50 may be, for example, a dielectric multilayer film.

The organic electroluminescent elements 1 and 1a illustrated in FIGS. 1A and 1B include a substrate 60 on the side of the first electrode 10 opposite to the side on which the organic light emitting layer 30 is provided. In other words, the first electrode 10 is provided between the substrate 60 and the organic light emitting layer 30. The substrate 60 is transmissive to the light emitted from the organic light emitting layer 30. The substrate 60 is, for example, a glass substrate.

The organic electroluminescent elements 1 and 1a are bottom-emission type organic electroluminescent elements. The intensity of the light emitted from the organic light emitting layer 30 that passes through the first electrode 10 and the substrate 60 is higher than the intensity of the light emitted from the organic light emitting layer 30 that passes through the reflective layer 50. The light emitted from the organic light emitting layer 30 is extracted mainly from the first electrode 10 side (the substrate 60 side).

The decrease of the plasmon loss described above will now be described further.

Figure 2A:
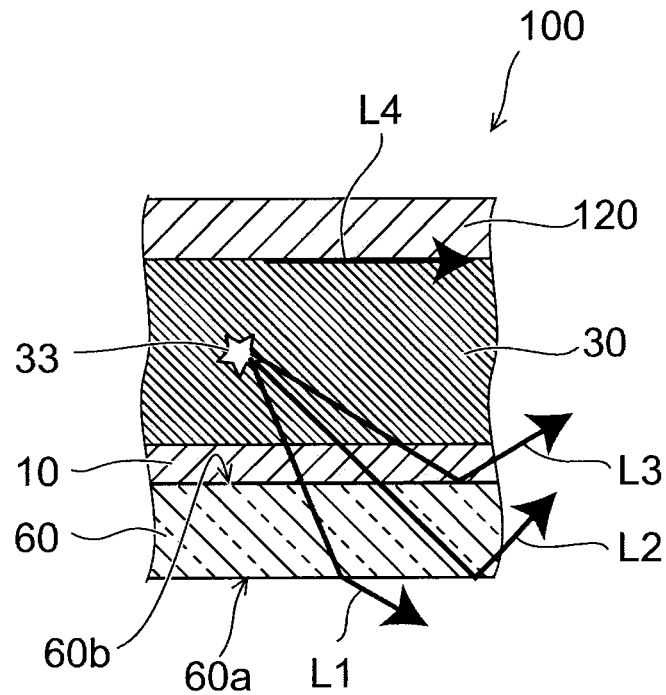
FIGS. 2A and 2B are schematic views illustrating the loss of the light produced at a light emission position 33 inside the organic light emitting layer 30 provided in an organic electroluminescent element 100 according to a comparative example.
Figure 2B:
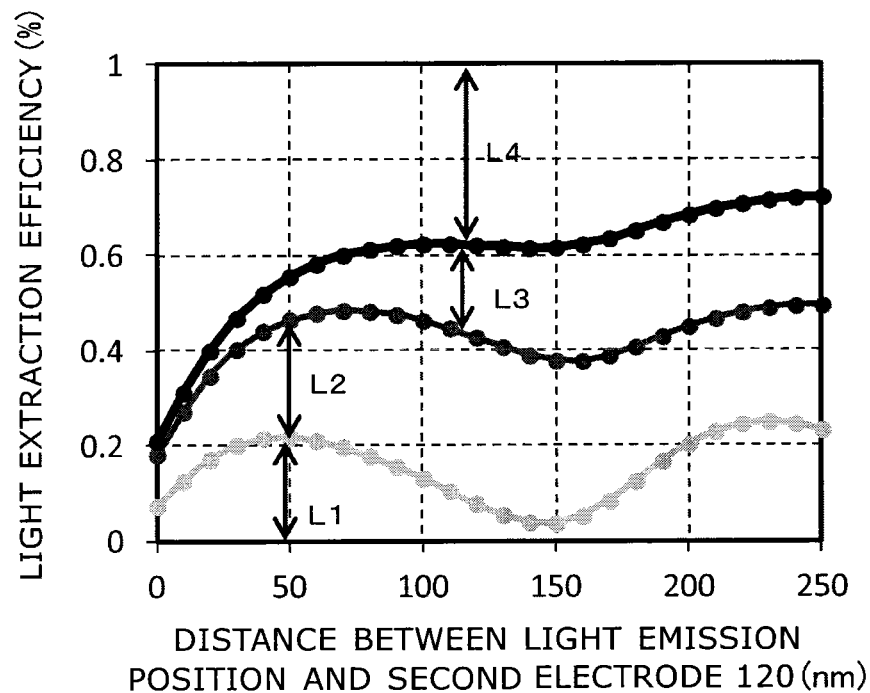

FIGS. 2A and 2B are schematic views illustrating the loss of the light produced at a light emission position 33 inside the organic light emitting layer 30 provided in an organic electroluminescent element 100 according to a comparative example.

FIG. 2A is a schematic cross-sectional view illustrating paths of the light produced at the light emission position 33 inside the organic light emitting layer 30. FIG. 2B is a graph illustrating the distribution ratio of the optical modes. FIG. 2B shows an example of simulation results of the light extraction efficiency. The horizontal axis of FIG. 2B represents the distance from the light emission position 33 to a second electrode 120. The vertical axis of FIG. 2B represents the light extraction efficiency. The conditions of the simulation were as follows. The first electrode 10 was made of ITO having a refractive index of 1.8 to 2.2 and a thickness dimension of 110 nanometers (nm). The organic light emitting layer 30 had a refractive index of 1.9; and the thickness dimension of the organic light emitting layer 30 was such that 80 nanometers (nm) was added to each of the distances (each of the distances of the horizontal axis of FIG. 2B) from the light emission position 33 to the second electrode 120. The second electrode 120 was made of Al with a thickness dimension of 150 nanometers (nm). The substrate 60 had a refractive index of 1.5. The wavelength of the light produced at the light emission position 33 inside the organic light emitting layer 30 was 525 nanometers (nm).

As shown in FIG. 2A, the organic electroluminescent element 100 according to the comparative example includes the first electrode 10, the second electrode 120 made of a metal, the organic light emitting layer 30, and the substrate 60. In other words, the organic electroluminescent element 100 according to the comparative example has the configuration of a general organic electroluminescent element. Therefore, the organic electroluminescent element 100 according to the comparative example does not include the optical buffer layer 40 and the reflective layer 50 described above. Also, the second electrode 120 is not transmissive to the light emitted from the organic light emitting layer 30.

As shown in FIG. 2A, the paths of the light produced at the light emission position 33 inside the organic light emitting layer 30 of the organic electroluminescent element 100 can be largely divided into four classifications. The light produced at the light emission position 33 includes an external mode component L1, a substrate mode component L2, a thin film layer mode component L3, and a loss component L4 of the second electrode 120 which is made of a metal. Hereinbelow, "the loss component L4 of the second electrode 120 which is made of a metal" is called simply "the loss component L4".

The external mode component L1 is a component that can be extracted outside the organic electroluminescent element 100. The substrate mode component L2 is a component that reaches the substrate 60 but undergoes a total internal reflection at the interface between the substrate 60 and the external air. The thin film layer mode component L3 is a component that reaches the first electrode 10 but undergoes a total internal reflection at the interface between the first electrode 10 and the substrate 60. In such a case, the substrate mode component L2 can be extracted to the outside from a surface other than a surface 60a of the substrate 60 that contacts the external air and a surface 60b of the substrate 60 on the side opposing the first electrode 10, e.g., a surface that intersects the surface 60a or the surface 60b. The thin film layer mode component L3 can be extracted similarly to the outside from the first electrode 10. In other words, the external mode component L1, the substrate mode component L2, and the thin film layer mode component L3 are components that are extractable to the outside.

Conversely, the loss component L4 is a component having a loss due to the second electrode 120 which is made of a metal.

Here, the light that is incident on the second electrode 120 includes propagating light and non-propagating light.

The propagating light and the non-propagating light are components of the light emitted from the organic light emitting layer 30.

The propagating light is light that can propagate infinitely if propagating in a medium that does not absorb the propagating light.

The non-propagating light is light for which the intensity attenuates exponentially as the propagation distance increases.

In the case where there is a boundary between the light emission position 33 and the second electrode 120 where the refractive indexes are different, there are cases where a portion of the propagating light becomes non-propagating light due to a total internal reflection and reaches the second electrode 120.

The loss component L4 includes the loss of the propagating light and the loss of the non-propagating light.

The loss of the propagating light (hereinbelow, the propagating light loss) is the loss due to being absorbed by the second electrode 120. The propagating light loss does not depend on the distance between the light emission position 33 and the second electrode 120.

The loss of the non-propagating light (hereinbelow, the non-propagating light loss) occurs due to an interaction between evanescent light and the electrons inside the metal of the second electrode 120. This interaction is called plasmon loss. The non-propagating light loss depends on the distance between the light emission position 33 and the second electrode 120 and decreases as the distance between the light emission position 33 and the second electrode 120 increases.

As shown in FIG. 2B, for example, the external mode component L1, the substrate mode component L2, the thin film layer mode component L3, and the loss component L4 change with the distance from the light emission position 33 to the second electrode 120.

To increase the light extraction efficiency of the organic electroluminescent element 100, it is sufficient to reduce the portion of the loss component L4 that is related to the plasmon loss. To reduce the plasmon loss, it is sufficient to increase the distance between the light emission position 33 and the second electrode 120.

Therefore, in the organic electroluminescent elements 1 and 1a according to the embodiment, the second electrode 20 is transmissive to the light emitted from the organic light emitting layer 30. Therefore, the plasmon loss of the second electrode 20 can be reduced.

The optical buffer layer 40 is provided between the second electrode 20 and the reflective layer 50. Therefore, the plasmon loss of the reflective layer 50 can be reduced because the distance between the light emission position 33 and the reflective layer 50 can be increased.

The refractive index of the optical buffer layer 40 and the thickness dimension of the optical buffer layer 40 that are described above will now be described further.

Figure 3:
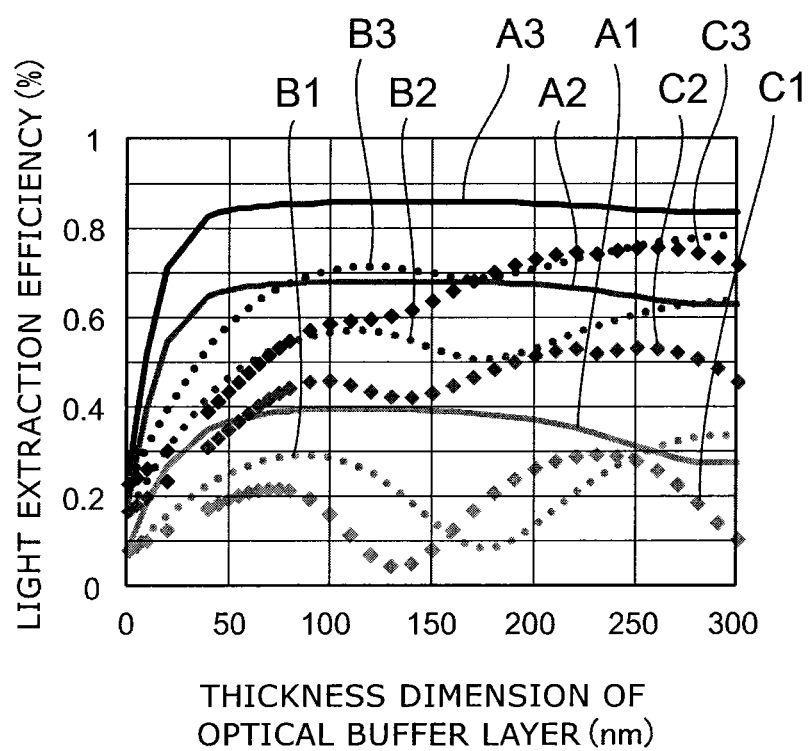
FIG. 3 shows an example of simulation results of the light extraction efficiency.

FIG. 3 is a graph illustrating the light extraction efficiency of the organic electroluminescent elements 1 and 1a according to the first embodiment.

The horizontal axis of FIG. 3 represents the thickness dimension of the optical buffer layer 40 (the distance between the second electrode 20 and the reflective layer 50). The vertical axis of FIG. 3 represents the light extraction efficiency.

FIG. 3 shows an example of simulation results of the light extraction efficiency.

The conditions of the simulation were as follows. The first electrode 10 was made of ITO with a thickness dimension of 110 nanometers (nm). The organic light emitting layer 30 had a refractive index of 1.8 and a thickness dimension of 120 nanometers (nm). The second electrode 20 was made of Ag with a thickness dimension of 5 nanometers (nm). The reflective layer 50 was made of Ag with a thickness dimension of 150 nanometers (nm). The wavelength of the light produced at the light emission position 33 inside the organic light emitting layer 30 was 525 nanometers (nm). The substrate 60 had a refractive index of 1.5. The light extraction efficiency was determined for the cases where the refractive index of the optical buffer layer 40 was 1.0, 1.5, and 1.8.

In FIG. 3, A1, B1, and C1 show the external mode component L1. A1 is the case where the refractive index of the optical buffer layer 40 was 1.0. B1 is the case where the refractive index of the optical buffer layer 40 was 1.5. C1 is the case where the refractive index of the optical buffer layer 40 was 1.8.

In FIG. 3, A2, B2, and C2 show the sum of the external mode component L1 and the substrate mode component L2. A2 is the case where the refractive index of the optical buffer layer 40 was 1.0. B2 is the case where the refractive index of the optical buffer layer 40 was 1.5. C2 is the case where the refractive index of the optical buffer layer 40 was 1.8.

In FIG. 3, A3, B3, and C3 show the sum of the external mode component L1, the substrate mode component L2, and the thin film layer mode component L3. A3 is the case where the refractive index of the optical buffer layer 40 was 1.0. B3 is the case where the refractive index of the optical buffer layer 40 was 1.5. C3 is the case where the refractive index of the optical buffer layer 40 was 1.8.

It can be seen from FIG. 3 that the light extraction efficiency for each of the external mode component L1, the substrate mode component L2, and the thin film layer mode component L3 can be increased by reducing the refractive index of the optical buffer layer 40. In such a case, it is sufficient for the refractive index of the optical buffer layer 40 to be lower than the refractive index of the organic light emitting layer 30 (e.g., 1.8 to 2.2).

Also, it can be seen from FIG. 3 that the light extraction efficiency for each of the external mode component L1, the substrate mode component L2, and the thin film layer mode component L3 can be increased by setting the thickness dimension of the optical buffer layer 40 to be not less than 50 nanometers (nm).

The materials included in the second electrode 20, etc., will now be described further.

Figure 4:
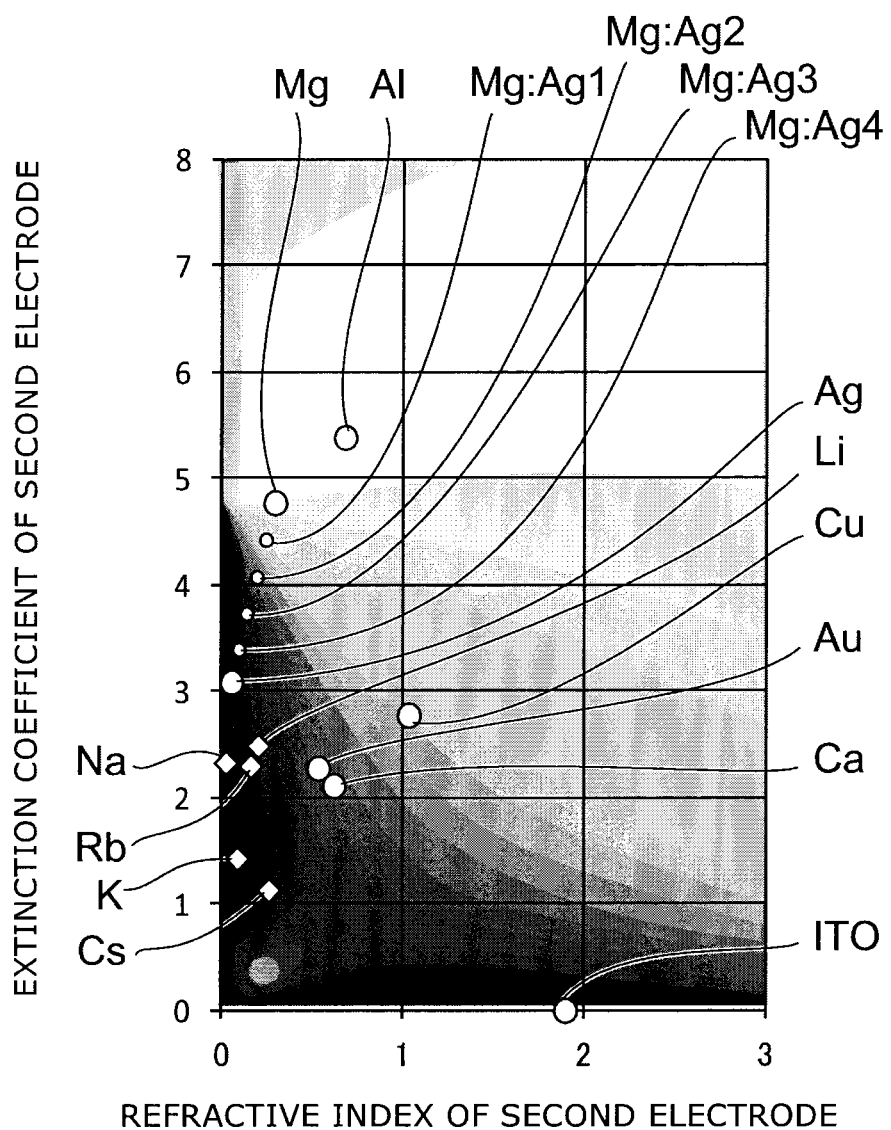
FIG. 4 is a graph illustrating the relationship between the light extraction efficiency and the material included in the second electrode 20.

FIG. 4 is a graph illustrating the relationship between the light extraction efficiency and the material included in the second electrode 20.

The horizontal axis of FIG. 4 represents the refractive index of the second electrode 20. The vertical axis of FIG. 4 represents the extinction coefficient of the second electrode 20.

The symbols in FIG. 4 indicate the materials. Mg:Ag indicates a magnesium-silver alloy; Mg:Ag1 has a volume ratio of magnesium and silver of 0.8:0.2; Mg:Ag2 has a volume ratio of magnesium and silver of 0.6:0.4 Mg:Ag3 has a volume ratio of magnesium and silver of 0.4:0.6; and Mg:Ag4 has a volume ratio of magnesium and silver of 0.2:0.8.

In FIG. 4, the degree of the light extraction efficiency is shown by monotone shading. Here, higher light extraction efficiencies are darker; and lower light extraction efficiencies are lighter.

FIG. 4 shows an example of simulation results of the light extraction efficiency.

The conditions of the simulation were as follows. The first electrode 10 was made of ITO with a thickness dimension of 110 nanometers (nm). The organic light emitting layer 30 had a refractive index of 1.8 and a thickness dimension of 120 nanometers (nm). The second electrode 20 had a thickness dimension of 5 nanometers (nm). The reflective layer 50 was made of Ag with a thickness dimension of 150 nanometers (nm). The wavelength of the light produced at the light emission position 33 inside the organic light emitting layer 30 was 525 nanometers (nm). The optical buffer layer 40 had a refractive index of 1.0 and a thickness dimension of 100 nanometers (nm). The material included in the second electrode 20 was changed; and the light extraction efficiency was determined for each material.

It can be seen from FIG. 4 that the light extraction efficiency can be increased more when the material included in the second electrode 20 is Ag, Au, or Ca than when the material included in the second electrode 20 is Al, Mg, etc.

The light extraction efficiency can be increased further when the material included in the second electrode 20 is an alkaline metal.

FIG. 4 illustrates Li, Na, K, Rb, and Cs as examples of alkaline metals.

In such a case, it is sufficient for the second electrode 20 to include at least one species selected from the group consisting of Ag, Au, Ca, and an alkaline metal. For example, the second electrode 20 may be an electrode made of a simple substance of Ag, Au, Ca, or an alkaline metal. For example, the second electrode 20 may be an alloy including at least one species selected from the group consisting of Ag, Au, Ca, and an alkaline metal. For example, the second electrode 20 may be a co-deposited film of an insulator (e.g., LiF) and at least one species selected from the group consisting of Ag, Au, Ca, and an alkaline metal. For example, the second electrode 20 may be a co-deposited film of an insulator and an alloy including at least one species selected from the group consisting of Ag, Au, Ca, and an alkaline metal.

The second electrode 20 may be a magnesium-silver alloy in which the volume fraction of Ag is not less than 0.2. The light extraction efficiency can be increased by the volume fraction of Ag in the magnesium-silver alloy being not less than 0.2. The second electrode 20 may be a co-deposited film of an insulator and a magnesium-silver alloy in which the volume fraction of Ag is not less than 0.2.

Thus, according to the first embodiment, an organic electroluminescent element having a high luminous efficiency can be obtained.

Second Embodiment

Figure 5:
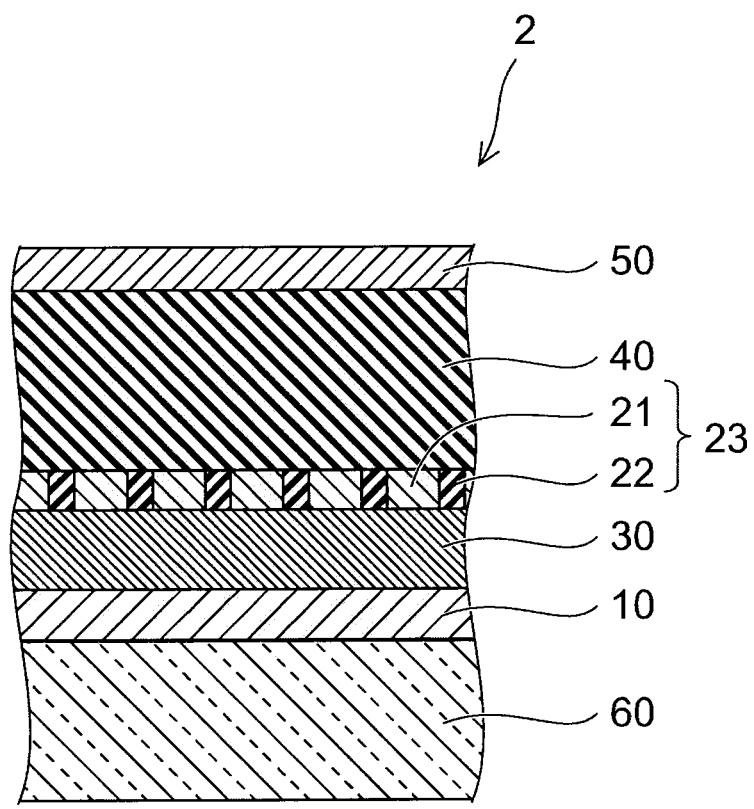
FIG. 5 is a schematic view illustrating an organic electroluminescent element 2 according to a second embodiment.

FIG. 5 is a schematic view illustrating an organic electroluminescent element 2 according to a second embodiment.

As shown in FIG. 5, the organic electroluminescent element 2 includes the first electrode 10, a second electrode 23, the organic light emitting layer 30, the optical buffer layer 40, and the reflective layer 50. Similarly to the organic electroluminescent element 1a described above, the first functional layer 31 and the second functional layer 32 also may be included. The organic electroluminescent element 2 includes the second electrode 23 instead of the second electrode 20 described above. The second electrode 23 will now be described.

The second electrode 23 has a first portion 21, and a second portion 22 that has a different refractive index than the first portion 21.

The second electrode 23 is provided between the first electrode 10 and the reflective layer 50. The second electrode 23 is transmissive to the light emitted from the organic light emitting layer 30.

The second electrode 23 functions as, for example, a cathode. The thickness dimension of the second electrode 23 may be, for example, not more than 10 nanometers (nm).

As described above, the light extraction efficiency can be increased if the second electrode 23 is formed using a material having a low refractive index and a low extinction coefficient. However, there are not many types of materials that have a low refractive index and a low extinction coefficient.

Therefore, the types of materials that can be used when forming the second electrode 23 are increased by the second electrode 23 having the first portion 21 and the second portion 22 which has a different refractive index than the first portion 21.

In such a case, the refractive index of the material included in the second portion 22 may be lower than the refractive index of the material included in the first portion 21.

For example, the first portion 21 may be formed from Al; and the second portion 22 may be formed from a material, a gas, etc., that has a lower refractive index than Al.

For example, the first portion 21 may be formed in a mesh configuration; and the second portion 22 may be provided in the hole portions. Or, the second portion 22 may be provided by being dispersed in the interior of the first portion 21.

Also, the refractive index of the material included in the first portion 21 may be lower than the refractive index of the material included in the second portion 22.

For example, the second portion 22 may be formed from Al; and the first portion 21 may be formed from a material, a gas, etc., that has a lower refractive index than Al.

For example, multiple second portions 22 may be formed to be separated from each other; and the first portion 21 may be provided around the multiple second portions 22.

Although the case is shown where the first portion 21 and the second portion 22 are provided, three or more types of portions having mutually-different refractive indexes may be provided.

The proportion of the first portion 21 and the second portion 22, etc., are not particularly limited and may be modified appropriately according to the materials of the first portion 21 and the second portion 22, etc.

In such a case, the refractive index of the second electrode 23 as an entirety can be determined using effective medium approximation, etc.

Figure 6:
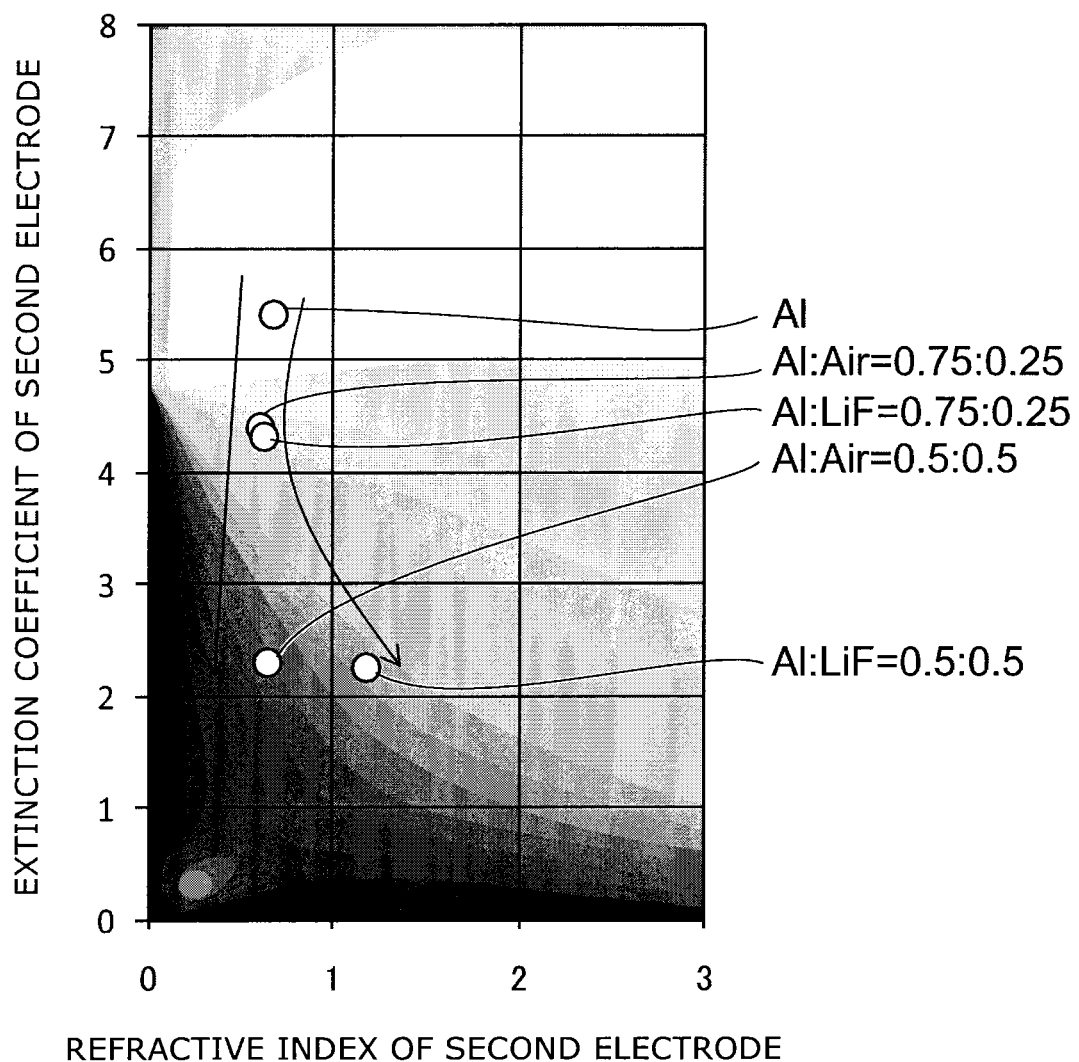
FIG. 6 is a graph illustrating the light extraction efficiency in the case where the first portion 21 and the second portion 22 are provided.

FIG. 6 is a graph illustrating the light extraction efficiency in the case where the first portion 21 and the second portion 22 are provided.

The horizontal axis of FIG. 6 represents the refractive index of the second electrode 23. The vertical axis of FIG. 6 represents the extinction coefficient of the second electrode 23.

In FIG. 6, the degree of the light extraction efficiency is shown by monotone shading. Here, higher light extraction efficiencies are darker; and lower light extraction efficiencies are lighter.

FIG. 6 shows an example of simulation results of the light extraction efficiency.

The conditions of the simulation were as follows. The first electrode 10 was made of ITO with a thickness dimension of 110 nanometers (nm). The organic light emitting layer 30 had a refractive index of 1.8 with a thickness dimension of 120 nanometers (nm). The reflective layer 50 was made of Ag with a thickness dimension of 150 nanometers (nm). The wavelength of the light produced at the light emission position inside the organic light emitting layer 30 was 525 nanometers (nm). The optical buffer layer 40 had a refractive index of 1.0 and a thickness dimension of 100 nanometers (nm). The second electrode 23 had a thickness dimension of 5 nanometers (nm); the first portion 21 was made of Al; and the second portion 22 was made of air or LiF. The proportion of the first portion 21 and the second portion 22 was changed; and the light extraction efficiency was determined for each proportion.

Here, the volume ratio of the first portion 21 made of Al and the second portion 22 made of air was set to be 0.75:0.25 and 0.5:0.5. The volume ratio of the first portion 21 made of Al and the second portion 22 made of LiF was set to be 0.75:0.25 and 0.5:0.5.

It can be seen from FIG. 6 that the light extraction efficiency can be increased when the proportion of the second portion 22 made of the material such as air, LiF, etc., that has the low refractive index is large. Therefore, it is possible to use Al or the like which has a low light extraction efficiency as the material of the second electrode 23. As a result, the types of materials that can be used when forming the second electrode 23 can be increased.

Although the case where Al is used as the material of the first portion 21 is shown as an example, cases where other materials are used also are similar. In such cases, the light extraction efficiency can be increased further by the first portion 21 including a material such as Ag, Au, Ca, an alkaline metal, etc., that has a high light extraction efficiency.

Thus, according to the second embodiment, an organic electroluminescent element having a high luminous efficiency can be obtained.

Third Embodiment

Figure 7:
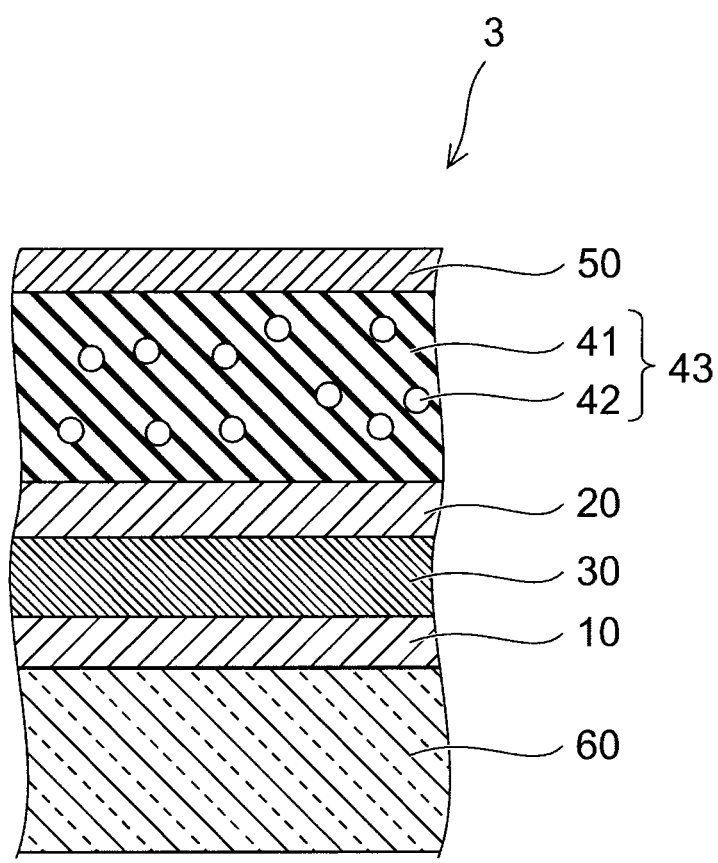
FIG. 7 is a schematic view illustrating an organic electroluminescent element 3 according to a third embodiment.

FIG. 7 is a schematic view illustrating an organic electroluminescent element 3 according to a third embodiment.

As shown in FIG. 7, the organic electroluminescent element 3 includes the first electrode 10, the second electrode 20, the organic light emitting layer 30, an optical buffer layer 43, and the reflective layer 50. Similarly to the organic electroluminescent element 1a described above, the first functional layer 31 and the second functional layer 32 also may be included. The organic electroluminescent element 3 includes the optical buffer layer 43 instead of the optical buffer layer 40 described above. The optical buffer layer 43 will now be described.

The optical buffer layer 43 includes a base portion 41, and an adjuster 42 having a refractive index that is lower than the refractive index of the base portion 41.

The optical buffer layer 43 is provided between the second electrode 20 and the reflective layer 50.

The thickness dimension of the optical buffer layer 43 may be 50 nanometers (nm) or more.

The refractive index of the optical buffer layer 43 is lower than the refractive index of the organic light emitting layer 30.

As shown in FIG. 3, the light extraction efficiency can be increased for each of the external mode component L1, the substrate mode component L2, and the thin film layer mode component L3 by reducing the refractive index of the optical buffer layer 43.

Therefore, the refractive index of the optical buffer layer 43 is reduced by the optical buffer layer 43 including the base portion 41 and the adjuster 42 having a refractive index that is lower than the refractive index of the base portion 41.

For example, the base portion 41 may be formed from $SiO_2$; and the adjuster 42 may be formed from a material, a gas, etc., that has a lower refractive index than $SiO_2$.

For example, the base portion 41 may be formed in a film-like configuration; and multiple voids may be provided by being dispersed in the interior of the base portion 41. For example, the optical buffer layer 43 may be a porous body.

The proportion of the base portion 41 and the adjuster 42, etc., are not particularly limited and may be modified appropriately according to the materials of the base portion 41 and the adjuster 42, etc.

In such a case, the refractive index of the optical buffer layer 43 as an entirety can be determined using effective medium approximation, etc.

Figure 8A:
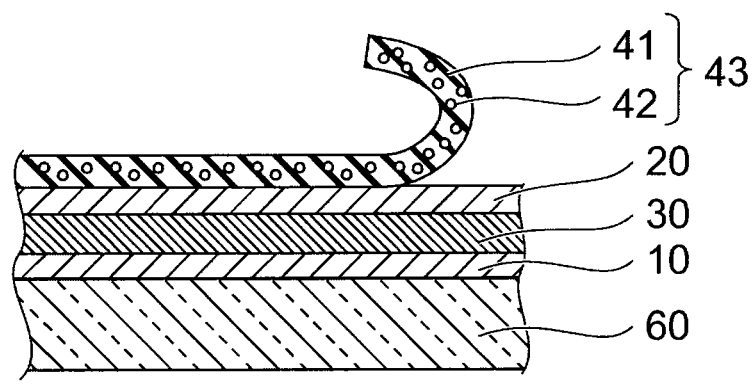
FIGS. 8A and 8B are schematic views illustrating methods for forming the optical buffer layer 43.
Figure 8B:
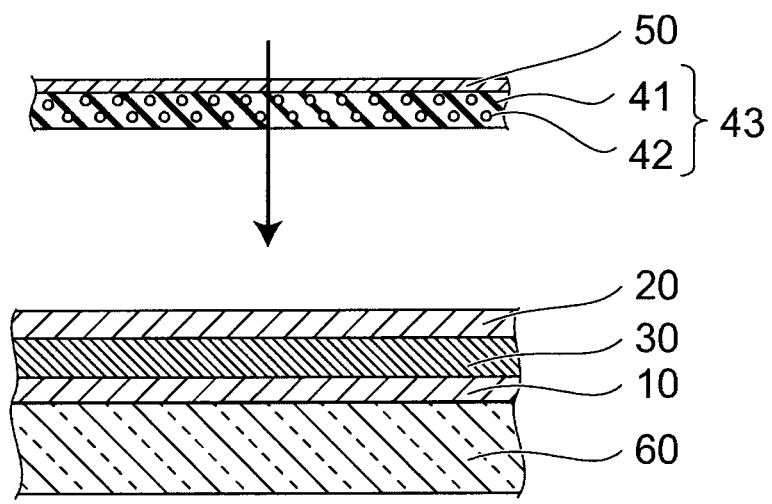

FIGS. 8A and 8B are schematic views illustrating methods for forming the optical buffer layer 43.

As shown in FIG. 8A, the optical buffer layer 43 may be formed beforehand in a film-like configuration; and the optical buffer layer 43 having the film-like configuration may be adhered to the surface of the second electrode 20 on the side opposite to the side on which the organic light emitting layer 30 is provided.

As shown in FIG. 8B, the optical buffer layer 43 having the film-like configuration may be formed beforehand on the surface of the reflective layer 50 on the second electrode 20 side; and the reflective layer 50 and the optical buffer layer 43 may be provided on the surface of the second electrode 20 on the side opposite to the side on which the organic light emitting layer 30 is provided. The optical buffer layer 43 may be provided on one surface of the reflective layer 50 by a known vapor deposition method, etc.

Thus, according to the third embodiment, an organic electroluminescent element having a high luminous efficiency can be obtained.

Fourth Embodiment

Figure 9:
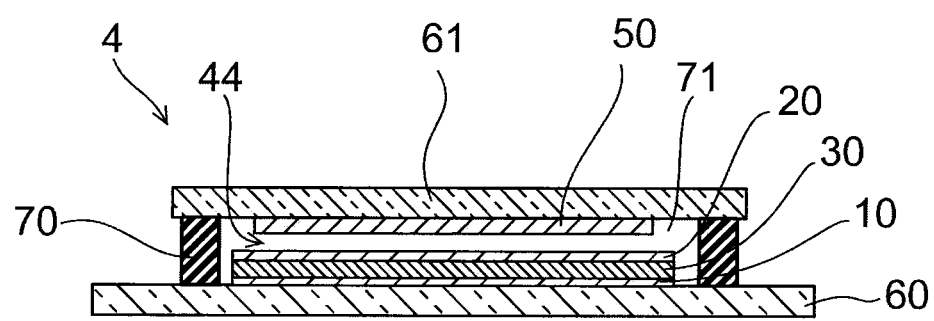
FIG. 9 is a schematic view illustrating an organic electroluminescent element 4 according to a fourth embodiment.

FIG. 9 is a schematic view illustrating an organic electroluminescent element 4 according to a fourth embodiment.

As shown in FIG. 9, the organic electroluminescent element 4 includes the first electrode 10, the second electrode 20, the organic light emitting layer 30, an optical buffer layer 44, the reflective layer 50, the substrate 60, a substrate 61, and a sealing unit 70. Similarly to the organic electroluminescent element 1a described above, the first functional layer 31 and the second functional layer 32 also may be included.

The organic electroluminescent element 4 includes the optical buffer layer 44 instead of the optical buffer layer 40 described above. The organic electroluminescent element 4 further includes the substrate 61 and the sealing unit 70. The optical buffer layer 44, the substrate 61, and the sealing unit 70 will now be described.

The substrate 61 is provided to face the substrate 60.

The substrate 61 may or may not be transmissive to the light emitted from the organic light emitting layer 30.

The reflective layer 50 is provided on the surface of the substrate 61 on the side facing the substrate 60.

The reflective layer 50 is provided to be separated from the second electrode 20. Therefore, a space is formed between the reflective layer 50 and the second electrode 20.

One end portion side of the sealing unit 70 is provided around the rim of the substrate 60. One other end portion side of the sealing unit 70 is provided around the rim of the substrate 61. The sealing unit 70 is formed from, for example, a frit material, etc., to seal a space 71 defined by the substrate 60, the substrate 61, and the sealing unit 70.

For example, a gas such as air, nitrogen gas, a noble gas, etc., is filled into the space 71.

Therefore, the gas is also filled into the space made between the reflective layer 50 and the second electrode 20.

The optical buffer layer 44 is made of the gas filled into the space made between the second electrode 20 and the reflective layer 50. In other words, the optical buffer layer 44 includes the gas filled between the second electrode 20 and the reflective layer 50.

As shown in FIG. 3, the light extraction efficiency can be increased for each of the external mode component L1, the substrate mode component L2, and the thin film layer mode component L3 by reducing the refractive index of the optical buffer layer 44.

Generally, the light extraction efficiency can be increased by the optical buffer layer 44 being made of a gas because gases generally have refractive indexes lower than those of solids or liquids.

Here, the reflectance can be increased by the reflective layer 50 being a dielectric multilayer film.

However, generally, dielectric multilayer films are formed by vapor deposition, etc. Therefore, there is a risk that the second electrode 20, the organic light emitting layer 30, etc., may be damaged when forming a dielectric multilayer film on the surface of the second electrode 20 on the side opposite to the side on which the organic light emitting layer 30 is provided.

In the embodiment, the reflective layer 50 is provided on the substrate 61. Therefore, there is no risk of damaging the second electrode 20, the organic light emitting layer 30, etc., even in the case where a reflective layer 50 that is a dielectric multilayer film is formed by a known vapor deposition method, etc.

Therefore, it is possible for the reflective layer 50 to be a dielectric multilayer film.

Thus, according to the fourth embodiment, an organic electroluminescent element having a high luminous efficiency can be obtained.

Fifth Embodiment

Figure 10A:
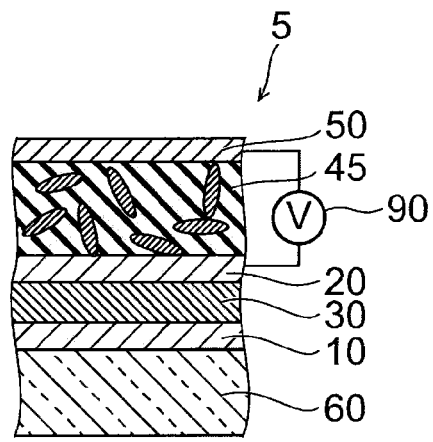
FIGS. 10A to 10C are schematic views illustrating an organic electroluminescent element 5 according to a fifth embodiment.
Figure 10B:
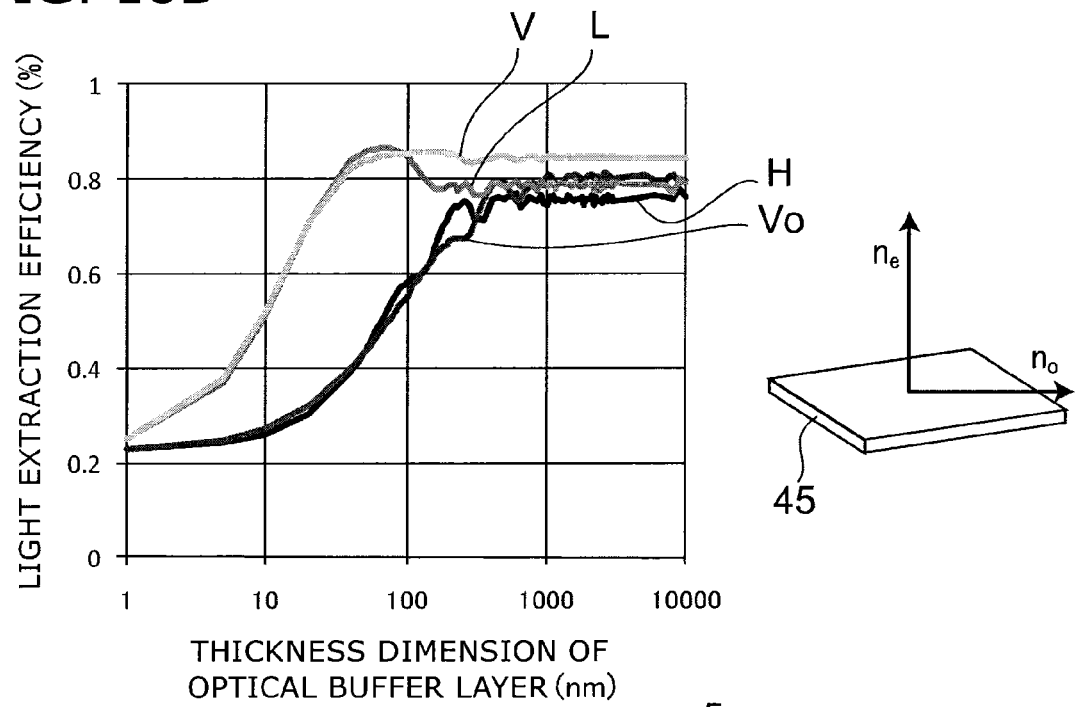
Figure 10C:
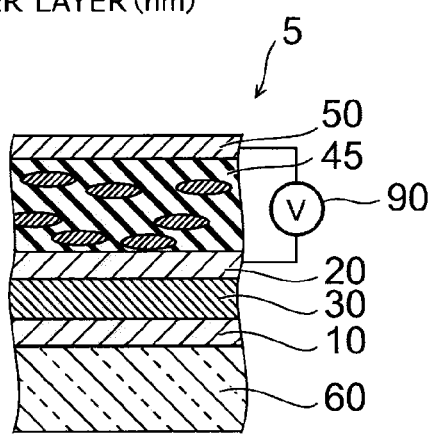

FIGS. 10A to 10C are schematic views illustrating an organic electroluminescent element 5 according to a fifth embodiment.

FIG. 10A is a schematic view illustrating the state prior to the control of the refractive index of an optical buffer layer 45; FIG. 10B is a graph illustrating the control of the refractive index of the optical buffer layer 45; and FIG. 10C is a schematic view illustrating the state after the control of the refractive index of the optical buffer layer 45.

As shown in FIG. 10A, the organic electroluminescent element 5 includes the first electrode 10, the second electrode 20, the organic light emitting layer 30, the optical buffer layer 45, the reflective layer 50, the substrate 60, and a control unit 90. Similarly to the organic electroluminescent element 1a described above, the first functional layer 31 and the second functional layer 32 also may be included.

The organic electroluminescent element 5 includes the optical buffer layer 45 instead of the optical buffer layer 40 described above. Also, the control unit 90 that applies a voltage to the second electrode 20 and the reflective layer 50 is included. The optical buffer layer 45 and the control unit 90 will now be described.

The optical buffer layer 45 is provided between the second electrode 20 and the reflective layer 50.

The thickness dimension of the optical buffer layer 45 may be 50 nanometers (nm) or more.

The optical buffer layer 45 is formed from a material that has an anisotropic refractive index.

The optical buffer layer 45 includes, for example, a liquid crystal.

Herein, as shown in FIG. 10B, the refractive index of the optical buffer layer 45 in the thickness direction is ne; and the refractive index of the optical buffer layer 45 in a direction orthogonal to the thickness direction is no.

In FIG. 10B, H and L are cases where the optical buffer layer is formed from a material that has an isotropic refractive index. Here, H is the case where ne=no=1.8; and L is the case where ne=no=1.0.

In FIG. 10B, $V_0$ and V are cases where the optical buffer layer 45 includes a liquid crystal. Here, $V_0$ is the case where the crystal has positive uniaxiality (ne>no) and is the case where ne=1.8 and no=1.0. V is the case where the crystal has negative uniaxiality (ne<no) and is the case where ne=1.0 and no=1.8.

It can be seen from FIG. 10B that the light extraction efficiency can be increased by the crystal having a negative uniaxiality, that is, by reducing the refractive index ne in the thickness direction.

In such a case, if the optical buffer layer 45 includes the liquid crystal, the refractive index ne in the thickness direction can be reduced by applying the voltage to the optical buffer layer 45.

For example, as shown in FIG. 10A, there are cases where the crystal of the optical buffer layer 45 has a positive uniaxiality. In such a case, as shown in FIG. 10C, the crystal of the optical buffer layer 45 can be controlled to have a negative uniaxiality by the control unit 90 applying a voltage to the optical buffer layer 45. In other words, the control unit 90 controls the crystal of the optical buffer layer 45 to have a negative uniaxiality by applying the voltage to the optical buffer layer 45. In such a case, the light extraction efficiency can be increased if the voltage is applied to the optical buffer layer 45 when causing the organic electroluminescent element 5 to emit light.

Thus, according to the fifth embodiment, an organic electroluminescent element having a high luminous efficiency can be obtained.

Sixth Embodiment

Figure 11:
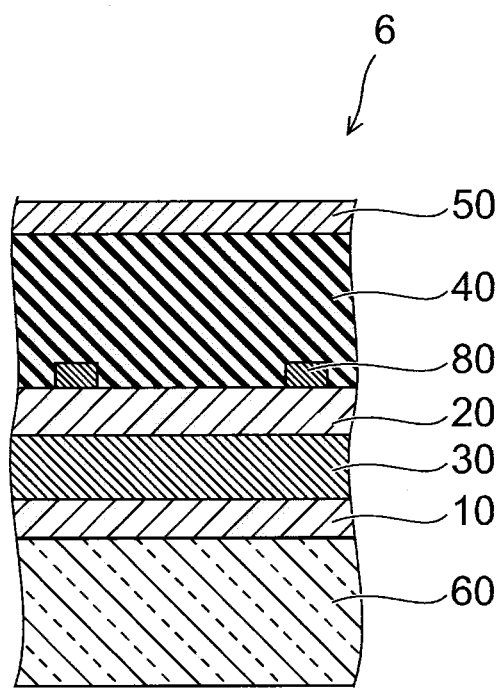
FIG. 11 is a schematic view illustrating an organic electroluminescent element 6 according to a sixth embodiment.

FIG. 11 is a schematic view illustrating an organic electroluminescent element 6 according to a sixth embodiment.

As shown in FIG. 11, the organic electroluminescent element 6 includes the first electrode 10, the second electrode 20, the organic light emitting layer 30, the optical buffer layer 40, the reflective layer 50, the substrate 60, and an auxiliary electrode 80. Similarly to the organic electroluminescent element 1a described above, the first functional layer 31 and the second functional layer 32 also may be included.

The organic electroluminescent element 6 further includes the auxiliary electrode 80. The auxiliary electrode 80 will now be described.

The auxiliary electrode 80 is provided to contact the surface of the second electrode 20 on the side opposite to the side on which the organic light emitting layer 30 is provided.

As described above, the second electrode 20 is an electrode that includes a material having a low refractive index and a low extinction coefficient. Therefore, there are cases where the electrical resistance of the second electrode 20 cannot be sufficiently low. In the case where the electrical resistance of the second electrode 20 is high, there is a risk that the potential difference between the portion proximal to the portion connected to the external power supply and the portion distal to the portion connected to the external power supply may become large. In the case where the potential difference between the portion proximal to the portion connected to the external power supply and the portion distal to the portion connected to the external power supply is large, there is a risk that uneven luminance may occur.

Therefore, the potential difference between the portion proximal to the portion connected to the external power supply and the portion distal to the portion connected to the external power supply is reduced by providing the auxiliary electrode 80 to contact the second electrode 20.

The auxiliary electrode 80 is formed from a material having a low electrical resistance. For example, the auxiliary electrode 80 may be formed from a metal such as Ag, Au, Al, etc.

The auxiliary electrode 80 may have, for example, a mesh configuration or a line configuration.

Thus, according to the sixth embodiment, an organic electroluminescent element having a high luminous efficiency can be obtained.

The organic electroluminescent elements recited in the first to sixth embodiments described above may be used in a light emitting device. The light emitting device that includes the organic electroluminescent elements recited in the first to sixth embodiments has a high luminance. As described below, other than a light emitting unit including the organic electroluminescent element, the light emitting device may include a drive unit and/or a control unit.

Figure 12:
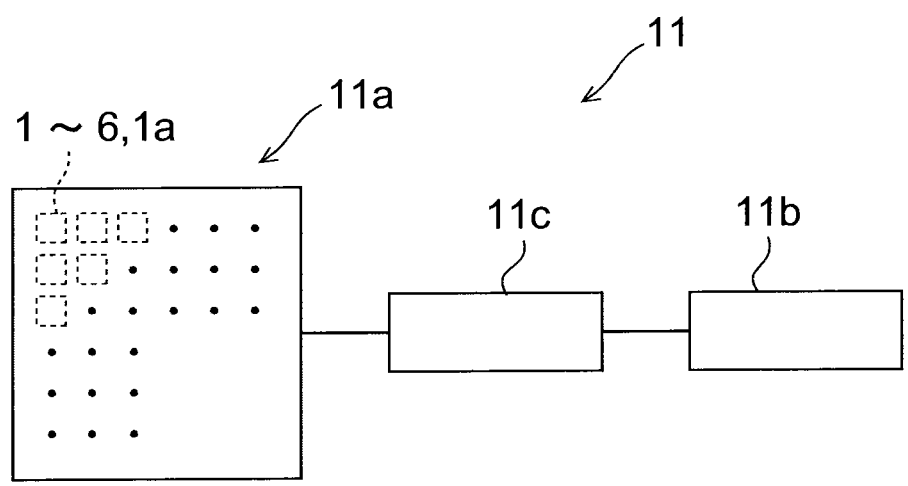
FIG. 12 is a schematic view illustrating a light emitting device 11.

FIG. 12 is a schematic view illustrating a light emitting device 11.

As shown in FIG. 12, a light emitting unit 11a, a drive unit 11b, and a control unit 11c are provided in the light emitting device 11.

The light emitting unit 11a includes multiple organic electroluminescent elements 1 to 6 and 1a described above. The disposition form of the organic electroluminescent elements 1 to 6 and 1a is not particularly limited. For example, the disposition may be regular as illustrated in FIG. 12 or may be any irregular disposition. The numbers of the organic electroluminescent elements 1 to 6 and 1a are not limited to those illustrated and may be modified appropriately.

The drive unit 11b may include, for example, a drive circuit that applies a current to all of the organic electroluminescent elements 1 to 6 and 1*a* or respectively applies currents to the organic electroluminescent elements 1 to 6 and 1*a*.

For example, in the case where the light emitting device 11 is a display device, the drive unit 11*b* may respectively apply currents to the organic electroluminescent elements 1 to 6 and 1*a*.

For example, in the case where the light emitting device 11 is an illumination device, the drive unit 11*b* may apply a current to all of the organic electroluminescent elements 1 to 6 and 1*a*.

The form of the driving of the drive unit 11*b* is not limited to those illustrated and may be modified appropriately according to the application of the light emitting device 11, etc.

The control unit 11*c* may include, for example, a control circuit that controls the drive unit 11*b*.

Known technology is applicable to the components other than the organic electroluminescent elements 1 to 6 and 1*a* described above. A detailed description relating to the light emitting unit 11*a*, the drive unit 11*b*, and the control unit 11*c* is therefore omitted.

Seventh Embodiment

FIGS. 13A to 13I are schematic views illustrating organic electroluminescent elements according to a seventh embodiment. FIGS. 14A to 14E are schematic views illustrating one cross-section of FIG. 13A. FIGS. 15A to 15E are schematic views illustrating one cross-section of FIG. 13E.

In the embodiment, the organic electroluminescent element has a light extraction structure converting the substrate mode component L2 to the external mode component L1. The light extraction structure is formed from, for example, a substrate having a refraction index not more than a refractive index of the first electrode 10 or the organic light emitting layer 30. The substrate may have, for example, a refractive index of n=1.5.

Figure 13G:
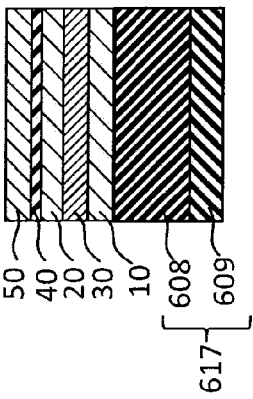
FIGS. 13A to 13I are schematic views illustrating organic electroluminescent elements according to a seventh embodiment.
Figure 13H:
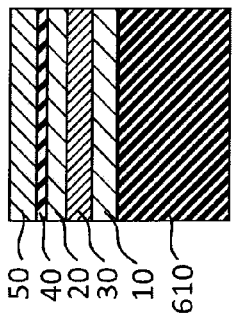
Figure 13I:
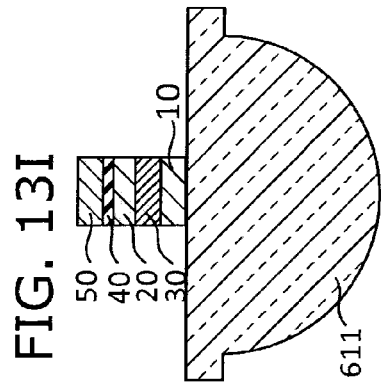
Figure 13D:
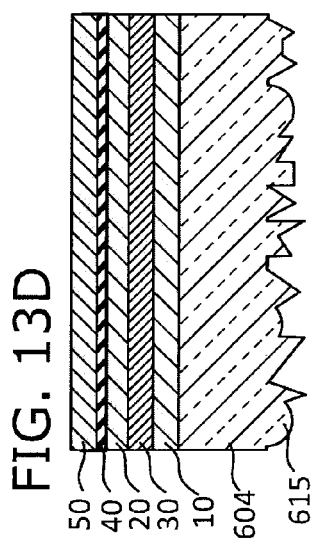
Figure 13E:
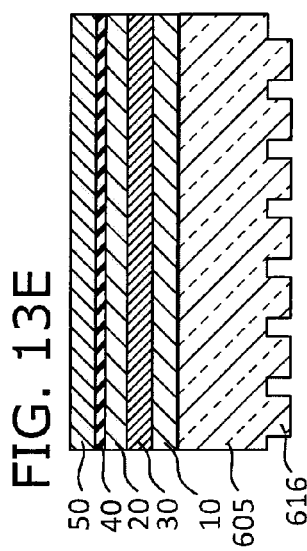
Figure 13F:
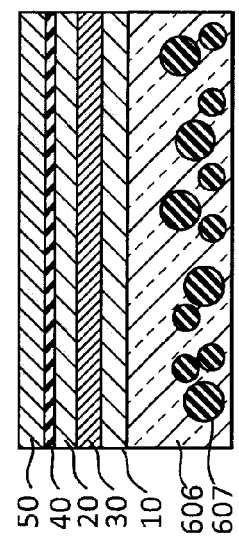
Figure 13A:
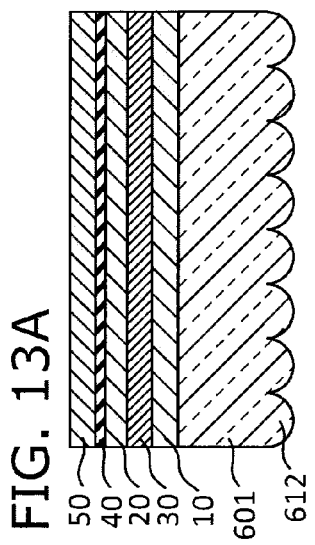

As shown in FIG. 13A, the organic electroluminescent element may include a substrate 601 having a microlens 612 as the light extraction structure. The first electrode 10 is provided between the substrate 601 and the organic light emitting layer 30. The microlens 612 of the substrate 601 is provided on a plane opposite to a plane opposing the first electrode 10.

Figure 14A:
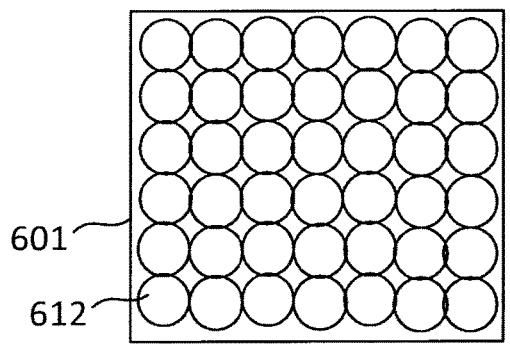
FIGS. 14A to 14E are schematic views illustrating cross-section of FIG. 13A.
Figure 14D:
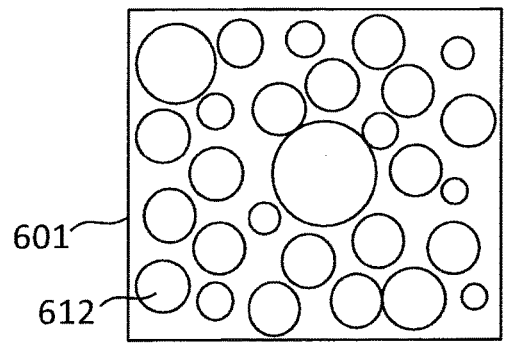
Figure 14B:
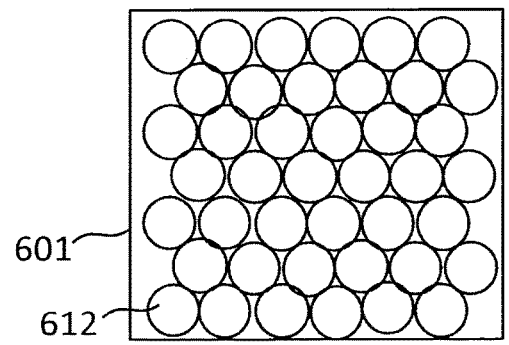
Figure 14E:
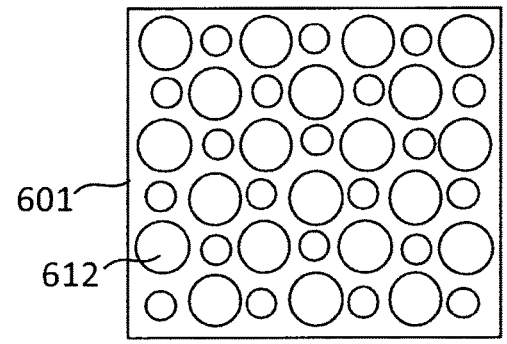
Figure 14C:
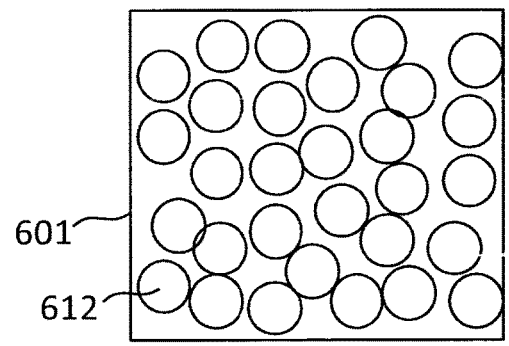
Figure 15A:
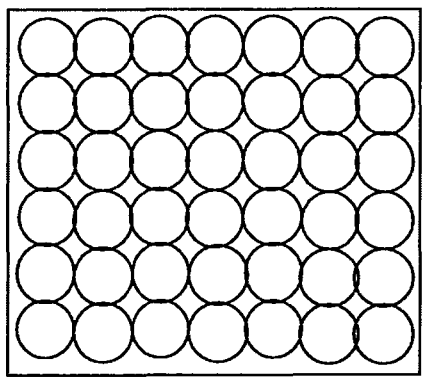
FIGS. 15A to 15E are schematic views illustrating cross-section of FIG. 13E.
Figure 15D:
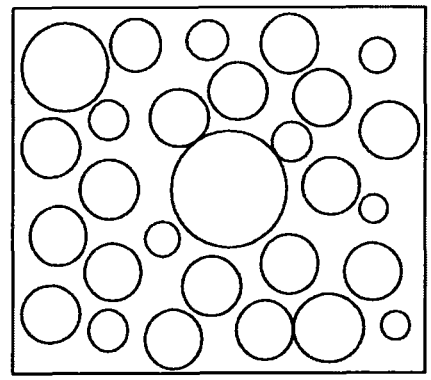
Figure 15B:
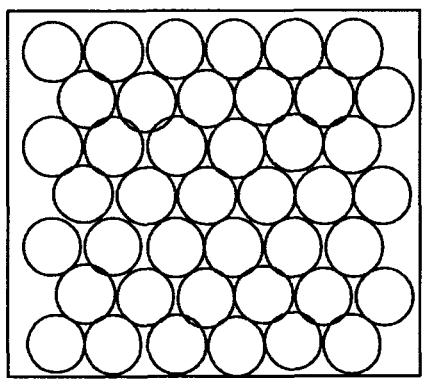
Figure 15E:
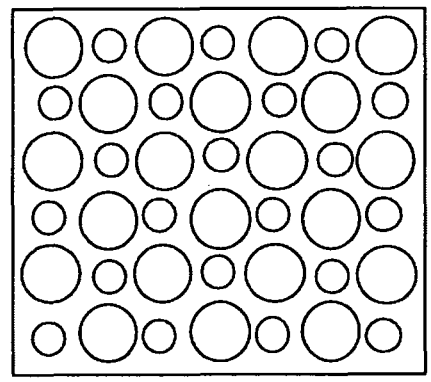
Figure 15C:
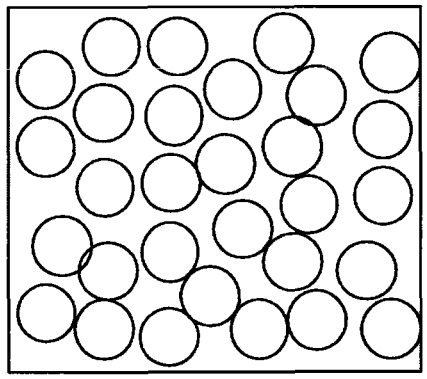

The microlens 612 can be arranged on one plane perpendicular to a stacking direction of the substrate 601, the first electrode 10 and the organic light emitting layer 30 as shown in FIGS. 14A to 14E. As shown in FIG. 14A, the microlenses 612 with the same degree of size can be arranged in a square lattice configuration on the one plane. As shown in FIG. 14B, the microlenses 612 with the same degree of size can be arranged in a hexagonal lattice configuration on the one plane. As shown in FIG. 14C, the microlenses 612 with the same degree of size can be arranged in a random configuration on the one plane. As shown in FIG. 14D, the microlenses 612 with different sizes can be arranged in a random configuration on the one plane. As shown in FIG. 14E, the microlenses 612 with different sizes can be arranged regularly on the one plane, for example the large microlenses 612 can be in a square lattice configuration and small microlenses 612 can be arranged in a square lattice configuration in gaps between the large microlenses.

Figure 13B:
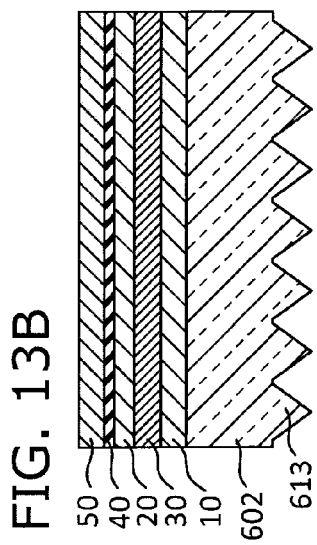

As shown in FIG. 13B, the organic electroluminescent element may include a substrate 602 having a pyramidal portion 613 as the light extraction structure. The first electrode 10 is provided between the substrate 602 and the organic light emitting layer 30. The pyramidal portion 613 of the substrate 602 is provided on a plane opposite to a plane opposing the first electrode 10. The pyramidal portion 613 can be, for example a pyramid such as a trigonal pyramid and a square pyramid, and a cone.

Figure 13C:
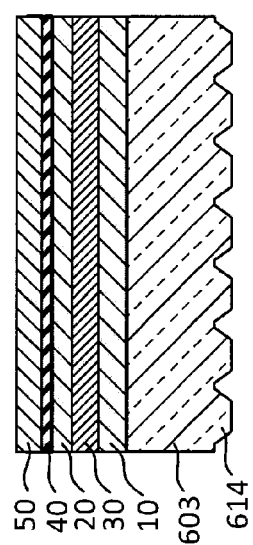

As shown in FIG. 13C, the organic electroluminescent element may include a substrate 603 having a frustum portion 614 as the light extraction structure. The first electrode 10 is provided between the substrate 603 and the organic light emitting layer 30. The frustum portion 614 of the substrate 603 is provided on a plane opposite to a plane opposing the first electrode 10. The frustum portion 614 can be, for example a pyramid frustum such as a trigonal pyramid frustum and a square pyramid frustum, and a cone.

The pyramidal portion 613 and the frustum portion 614 shown in FIGS. 13B and 13C may be arranged regularly or in random configuration similarly to the microlenses 612 shown in FIG. 13A. The pyramidal portion 613 and the frustum portion 614 may be of the same degree of size and may be arranged with different sizes.

As shown in FIG. 13D, the organic electroluminescent element may include a substrate 604 having an irregular concavoconvex portion 615 as the light extraction structure. The first electrode 10 is provided between the substrate 604 and the organic light emitting layer 30. The concavoconvex portion 615 of the substrate 604 is provided on a plane opposite to a plane opposing the first electrode 10. The concavoconvex portion 615 may be a shape combining, for example, a pyramid al body, a pyramid and a curved surface regularly or randomly.

The concavoconvex structure such as the microlens 612, the pyramidal portion 613, the frustum portion 614 and the concavoconvex portion 615 shown in FIGS. 13A to 13D prevents a total internal reflection by changing a traveling direction of the light between the substrate and the exterior. That is, the microlens 612, the pyramidal portion 613, the frustum portion 614 and the concavoconvex portion 615 convert the substrate mode component L2 to the external mode component L1.

As shown in FIG. 13E, the organic electroluminescent element may include a substrate 605 having a diffraction grating portion 616 as the light extraction structure. The first electrode 10 is provided between the substrate 605 and the organic light emitting layer 30. The diffraction grating portion 616 of the substrate 605 is provided on a plane opposite to a plane opposing the first electrode 10. When light is incident on the diffraction grating portion 616, diffraction phenomena due to interference of the light occur to change the traveling direction of the light. That is, the diffraction grating portion 616 converts the substrate mode component L2 to the external mode component L1.

As shown in FIG. 13F, the organic electroluminescent element may include a substrate 606 having a microsphere 607 as the light extraction structure. A diameter of the microsphere 607 can be, for example, larger than a wavelength of visible light, for example, 1 micrometer or more. The first electrode 10 is provided between the substrate 606 and the organic light emitting layer 30. The microsphere 607 may be on a side of a plane opposing the first electrode layer 10 of the substrate 606, and may be on a side opposite to a plane opposing the first electrode 10. The substrate 606 can include, for example, a substance and a resin layer sticking the substance with paste. The microsphere 607 can be, for example, air contained in the resin layer. When light is incident on the microsphere 607, the traveling direction of the light is changed due to refraction. That is, the microsphere 607 converts the substrate mode component L2 to the external mode component L1.

The microsphere 607 can be arranged as shown in FIGS. 15A to 15E on one plane perpendicular to a stacking direction of the substrate 601, the first electrode 10 and the organic light emitting layer 30. That is, the microsphere 607 may be arranged regularly in a square lattice configuration or a hexagonal lattice configuration, and may be arranged randomly. The microsphere 607 may be of the same degree of size and may be arranged with different sizes.

As shown in FIG. 13G, the organic electroluminescent element may include a substrate 617 including a support layer 608 and a light scattering layer 609 as the light extraction structure. The first electrode 10 is provided between the support layer 608 and the organic light emitting layer 30. The support layer 608 is provided between the first electrode 10 and the scattering layer 609. Alternatively, the first electrode 10 may be provided between the scattering layer 609 and the organic light emitting layer 30, and the scattering layer 609 may be provided between the first electrode 10 and the support layer 608.

As shown in FIG. 13H, the organic electroluminescent element may include a light scattering substrate 610 as the light extraction structure. The first electrode 10 is provided between the substrate 610 and the organic light emitting layer 30.

In FIGS. 13G and 13H, light incident on the scattering layer 609 or the substrate 610 changes the traveling direction of the light into various directions by scattering. That is, the scattering layer 609 or the substrate 610 converts the substrate mode component L2 to the external mode component L1.

As shown in FIG. 13I, the organic electroluminescent element may include a hemisphere lens 611 having a diameter larger than cross-section of a stacked structure of the first electrode 10, the organic light emitting layer 30 and the second electrode 20 as the light extraction structure. Since light is incident almost perpendicularly to an interface between the hemisphere lens 611 and the exterior, total internal reflection does not occur on this interface. Therefore, the hemisphere lens 611 converts the substrate mode component L2 to the external mode component L1.

FIGS. 16A to 16G are schematic views illustrating organic electroluminescent elements according to variations of the seventh embodiment, and corresponds to FIGS. 13A to 13G, respectively. As shown in these variations, it is also possible to provide a layer formed from a film or the like including the microlens 612, the pyramidal portion 613, the frustum portion 614, the concavoconvex portion 615 and the diffraction grating portion 616 on the support layer 600 to be a substrate. It is also possible to form the substrate 606 including the microsphere 607 from the film or the like. It is also possible to provide a film formed from the film or the like including the scattering layer 609 on the support layer 608 to be a substrate.

Eighth Embodiment

FIGS. 17A to 17J are schematic views illustrating organic electroluminescent element according to an eighth embodiment. FIGS. 18A to 18H are schematic views illustrating one cross-section of FIG. 17A. FIGS. 19A to 19G are schematic views illustrating one cross-section of FIG. 17H.

In the embodiment, the organic electroluminescent element has a light extraction structure converting the thin film mode component L3 to the substrate mode component L2 and the external mode component L1. The light extraction structure includes a substrate and a high refractive index layer. The substrate opposes the first electrode, and the high refractive index layer is provided between the substrate and the first electrode 10. The high refractive index layer is formed from a high refractive index material having a refractive index equivalent to or more than a refractive index of the first electrode layer 10 or the organic light emitting layer 30.

A plane of the high refractive index layer opposing the substrate can have a concavoconvex structure such as, for example, a microlens, a pyramidal portion, a frustum portion and a concavoconvex portion.

As shown in FIG. 17A, a plane of a high refractive index layer 701 opposing a substrate 621 may include a microlens being convex toward the plane opposing the first electrode 10.

Figure 18F:
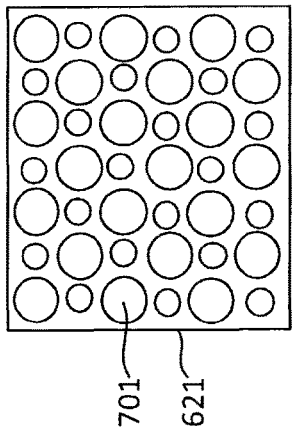
FIGS. 18A to 18H are schematic views illustrating cross-section of FIG. 17A.
Figure 18G:
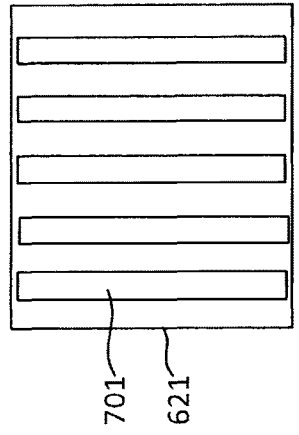
Figure 18H:
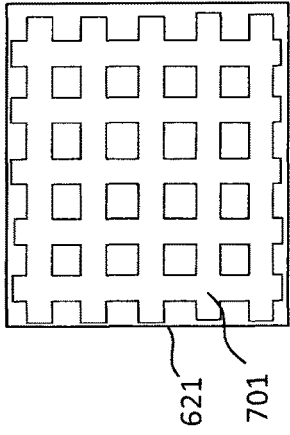
Figure 18C:
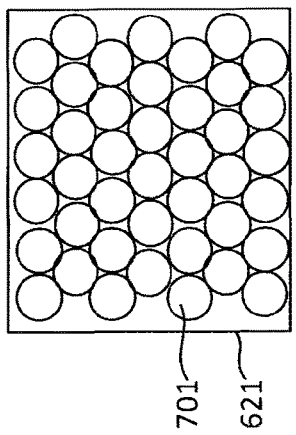
Figure 18D:
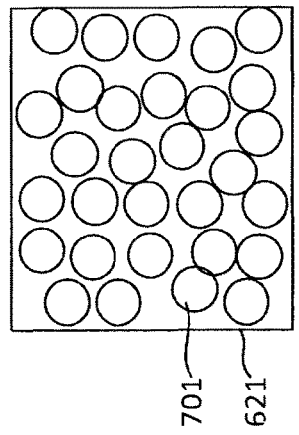
Figure 18E:
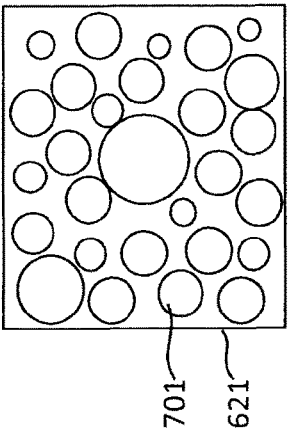
Figure 18A:
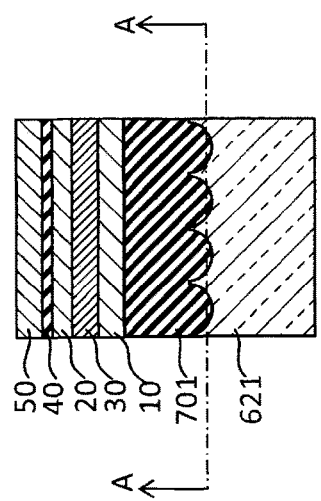
Figure 18B:
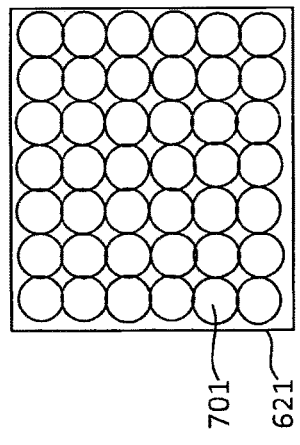
Figure 20A:
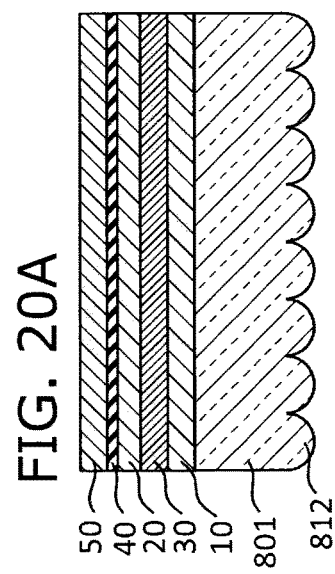
FIGS. 20A to 20I are schematic views illustrating organic electroluminescent elements according to a ninth embodiment.
Figure 20B:
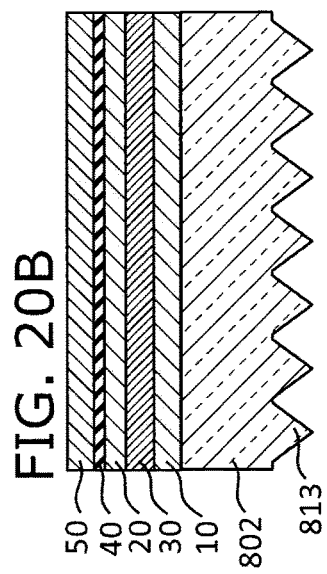
Figure 20C:
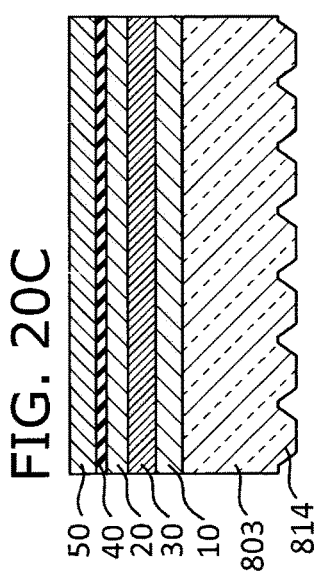
Figure 20D:
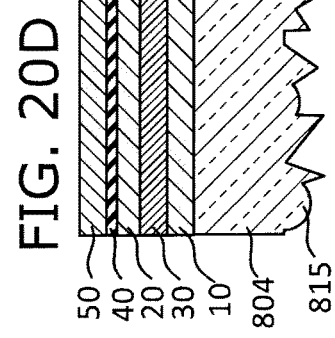
Figure 20E:
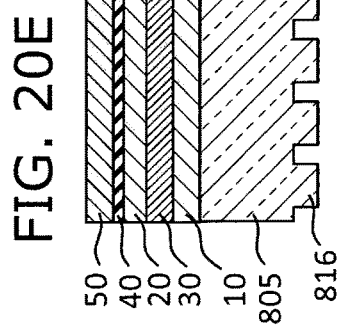
Figure 20F:
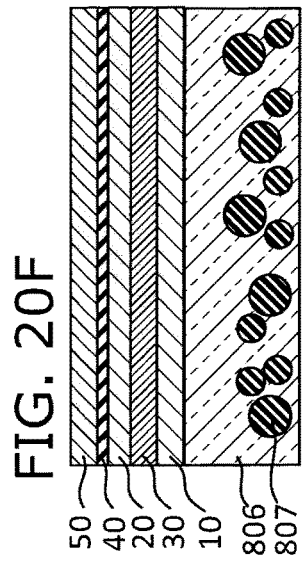
Figure 20G:
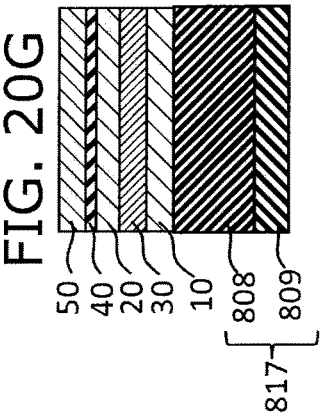
Figure 20H:
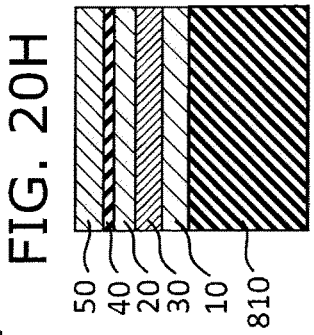
Figure 20I:
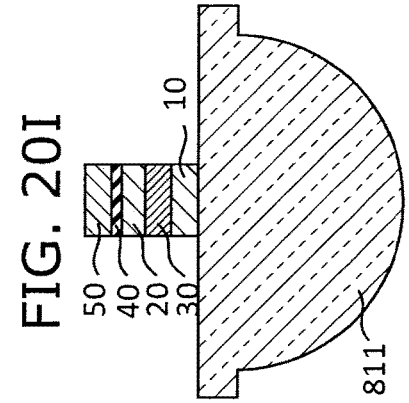

As shown in FIG. 18A, a convex portion can be arranged as shown in FIGS. 18B to 18H in an AA plane which is one planar surface perpendicular to a stacking direction of the substrate 601, the first electrode 10 and the organic light emitting layer 30. That is, as shown in FIGS. 18B to 18D, the convex portion may be arranged regularly in a square lattice configuration or a hexagonal lattice configuration, and may be arranged randomly. As shown in FIGS. 18E to 18F, the convex portion may be of the same degree of size and may be arranged with different sizes. Furthermore, as shown in FIG. 18G, the convex portions extending in one direction parallel to the AA plane may be arranged in parallel each other. Furthermore, as shown in FIG. 18H, the convex portions extending in one direction parallel to the AA plane may be formed in a lattice configuration.

As shown in FIG. 17B, a plane of a high refractive index layer 702 opposing a substrate 622 may have a microlens concave to the plane opposing the first electrode.

As shown in FIG. 17C, a plane of a high refractive index layer 703 opposing a substrate 623 may have a pyramidal portion convex to the plane opposing the first electrode 10.

As shown in FIG. 17D, a plane of a high refractive index layer 704 opposing a substrate 624 may have a frustum portion convex or concave to the plane opposing the first electrode 10.

As shown in FIG. 17E, a plane of a high refractive index layer 705 opposing a substrate 625 may have a concavoconvex portion having an irregular concavoconvex shape.

The high refractive index layer can be configured to be as follows other than having the concavoconvex structure.

As shown in FIG. 17F, a plane of a high refractive index layer 706 opposing a substrate 626 may have a lattice grating or a stripe grating.

As shown in FIG. 17G, a high refractive index layer 707 may have microsphere 717. For example, the microsphere has a diameter of a wavelength of visible light or more.

As shown in FIG. 17H, a high refractive index layer 708 may have a low refractive index portion 718 having a refractive index lower than a refractive index of the high refractive index layer 708 in a plane opposing a substrate 628. The convex portion can be arranged as shown in FIGS. 19B to 19E in the AA plane which is one planar surface perpendicular to the stacking direction of the substrate 628, the first electrode 10 and the organic light emitting layer 30 shown in FIG. 19A. That is, as shown in FIGS. 19B to 19E, the low refractive index portion can be a quadratic prism, a triangular prism, a hexagonal prism, a cylinder. The low refractive index portion can be arranged in a square lattice configuration or a hexagonal lattice configuration. As shown in FIGS. 19F to 19G, the low refractive index portion can also be in a stripe configuration or a lattice configuration.

Furthermore, as shown in FIG. 17I, the scattering layer may be provided between the high refractive index layer and the substrate.

Alternatively, as shown in FIG. 17J, the high refractive index layer is not provided and the scattering layer is provided between the first electrode and the substrate to be the light extraction structure.

In FIGS. 17A to 17J, the thin film mode component L3 can be converted to the substrate mode component L2 or the external mode component L1 by the light extraction structure.

Ninth Embodiment

FIGS. 20A to 20I are schematic views illustrating organic electroluminescent elements according to a ninth embodiment. FIGS. 20A to 20I show configuration similar to FIGS. 13A to 13I, respectively, however are different from FIGS. 13A to 13I in a point that the substrate forming the light extraction structure is formed from the high refractive index material having a refractive index equivalent to or more than a refractive index of a refractive index of the first electro 10 or the organic light emitting layer 30. Numerals 801 to 8017 in FIGS. 20A to 20I correspond to numerals 601 to 617 in FIGS. 13A to 13I, respectively.

FIGS. 21A to 21G are schematic views illustrating organic electroluminescent elements according to variations of the ninth embodiment, and correspond to FIGS. 20A to 20G, respectively. As shown in these variations, it is also possible to provide a layer formed from a film or the like including a microlens 812, a pyramidal portion 813, a frustum portion 814, a concavoconvex portion 815 and a diffraction grating portion 816 on the support layer 800 to be a substrate. It is also possible to form the substrate 806 including the microsphere 807 from the film or the like. It is also possible to provide a film formed from the film or the like including the scattering layer 809 on the support layer 808 to be a substrate.

The total internal reflection at an interface between the first electrode and the substrate disappears because of the light extraction structure like this, therefore, the thin film mode component L3 can be converted to the substrate mode component L2, and the substrate mode component L2 can be converted to the external mode component L1.

Tenth Embodiment

FIGS. 22A to 22D are schematic views illustrating organic electroluminescent elements according to a tenth embodiment. In the embodiment, the light extraction structure includes a low refractive index layer opposing the first electrode 10 and a high refractive index layer provided between the first electrode and the low refractive index. The low refractive index layer can adopt the substrate shapes used in the seventh embodiment and the variations, and the eighth embodiment. The high refractive index can adopt the substrate shapes used in the ninth embodiment and the variations. Combination of the shape of the low refractive index layer and the shape of the high refractive index layer is arbitrary. For example, one of the substrates shown in FIGS. 13A to 13I, FIGS. 16A to 16G, FIGS. 17A to 17J can be arbitrarily combined with one of the substrates shown in FIGS. 20A to 20I, FIGS. 21A to 21G.

Figure 22C:
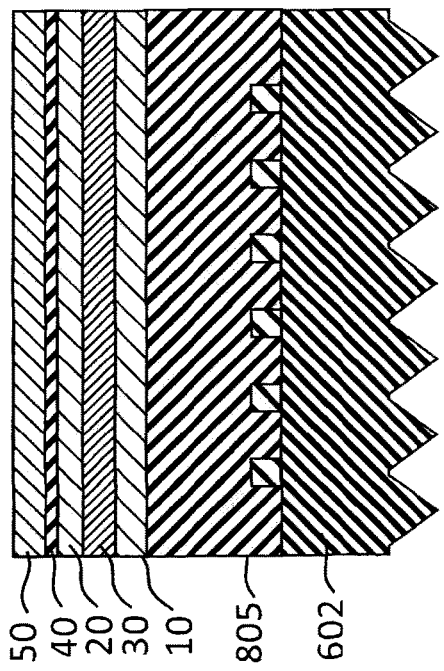
FIGS. 22A to 22D are schematic views illustrating organic electroluminescent elements according to a tenth embodiment.
Figure 22D:
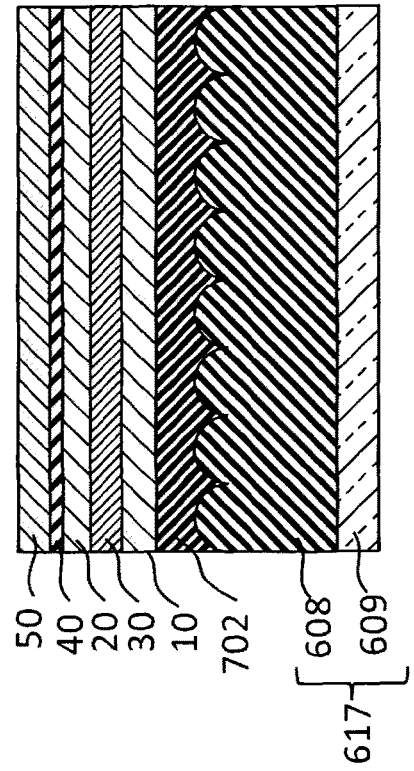
Figure 22A:
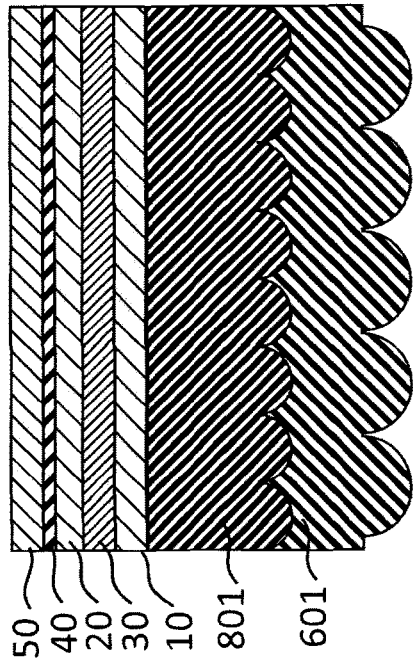
Figure 22B:
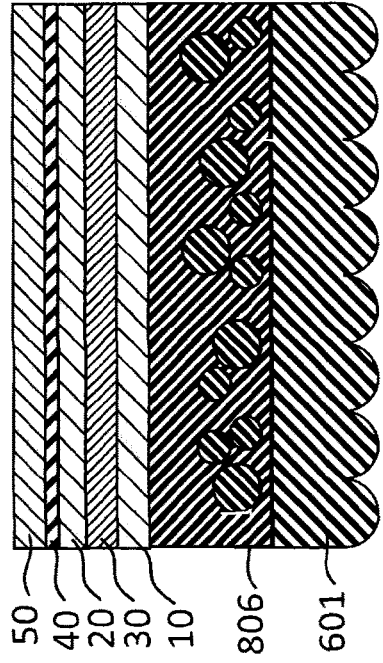

As one example, as shown in FIG. 22A, the light extraction structure including the high refractive index layer having microlenses on the plane opposing the low refractive index and the low refractive index layer having microlenses on a plane opposite to a plane opposing the low refractive index layer can be used.

The light extraction structure including the high refractive index layer having microspheres and the low refractive index layer having micro lenses can be used.

The light extraction structure including the high refractive index layer having a diffraction grating and the low refractive index layer having a pyramidal portion can be used.

Furthermore, the light extraction structure including the high refractive index layer having concave microlenses, the scattering layer and the low refractive index layer provided between the high refractive index layer and the scattering layer can be used.

The thin film mode component L3 can be converted to the substrate mode component L2 by the light extraction structure like this, and the substrate mode component L2 can be converted to the external mode component L1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An organic electroluminescent element, comprising:
   a first electrode;
   a reflective layer provided to face the first electrode;
   an organic light emitting layer provided between the first electrode and the reflective layer;
   a second electrode provided between the organic light emitting layer and the reflective layer;
   a first substrate;
   a second substrate;
   a sealing unit; and
   the second electrode is opposed to the reflective layer via a gap filled with a gas, the first electrode is provided between the first substrate and the organic light emitting layer, and the reflective layer is provided between the second substrate and an optical layer, one end portion side of the sealing unit is provided around the rim of the first substrate and the one other end portion side of the sealing unit is provided around the rim of the first substrate, the gas is filled into the space defined by the first substrate and the second substrate and the sealing unit.

2. The element according to claim 1, wherein the second electrode includes at least one species selected from the group consisting of Ag, Au, Ca, and an alkaline metal.

3. The element according to claim 1, wherein the second electrode has a first portion and a second portion, a refractive index of the second portion being different from a refractive index of the first portion.

4. The element according to claim 1, wherein the second electrode includes a co-deposited film of an insulator and at least one species selected from the group consisting of Ag, Au, Ca, and an alkaline metal, or a co-deposited film of an insulator and an alloy including the at least one species selected from the group.

5. The element according to claim 1, wherein the second electrode includes an alloy including at least one species selected from the group consisting of Ag, Au, Ca, and an alkaline metal.

6. The element according to claim 1, wherein the second electrode includes a magnesium-silver alloy, the volume fraction of Ag in the magnesium-silver alloy being not less than 0.2.

7. The element according to claim 1, further comprising a control unit configured to apply a voltage to the second electrode and the reflective layer, and the optical layer is provided between the second electrode and the reflective layer, the control unit being configured to control the optical buffer layer to have a negative uniaxiality by applying the voltage.

8. The element according to claim 1, further comprising a light extraction structure opposing the first electrode, the first electrode being provided between the light extraction structure and the organic light emitting layer.

9. An organic electroluminescent element, comprising:
a first electrode;
a reflective layer provided to face the first electrode;
an organic light emitting layer provided between the first electrode and the reflective layer;
a second electrode provided between the organic light emitting layer and the reflective layer;
a first substrate;
a second substrate;
a sealing unit; and
the second electrode is opposed to the reflective layer via a gap filled with a gas, wherein the second electrode includes at least one species selected from the group consisting of Ag, Au, Ca, and an alkaline metal, the first electrode is provided between the first substrate and the organic light emitting layer, and the reflective layer is provided between the second substrate and an optical layer, one end portion side of the sealing unit is provided around the rim of the first substrate and the one other end portion side of the sealing unit is provided around the rim of the first substrate, the gas is filled into the space defined by the first substrate and the second substrate and the sealing unit.

10. The element according to claim 9, wherein the second electrode has a first portion and a second portion, a refractive index of the second portion being different from a refractive index of the first portion.

11. The element according to claim 9, wherein the second electrode includes a co-deposited film of an insulator and at least one species selected from the group consisting of Ag, Au, Ca, and an alkaline metal, or a co-deposited film of an insulator and an alloy including the at least one species selected from the group.

12. The element according to claim 9, wherein the second electrode includes an alloy including at least one species selected from the group consisting of Ag, Au, Ca, and an alkaline metal.

13. The element according to claim 9, wherein the second electrode includes a magnesium-silver alloy, the volume fraction of Ag in the magnesium-silver alloy being not less than 0.2.

14. The element according to claim 9, further comprising a control unit configured to apply a voltage to the second electrode and the reflective layer, and the optical layer is provided between the second electrode and the reflective layer, the control unit being configured to control the optical buffer layer to have a negative uniaxiality by applying the voltage.

15. A light emitting device including an organic electroluminescent element, the element comprising:
a first electrode;
a reflective layer provided to face the first electrode;
an organic light emitting layer provided between the first electrode and the reflective layer;
a second electrode provided between the organic light emitting layer and the reflective layer;
a first substrate;
a second substrate;
a sealing unit; and
the second electrode is opposed to the reflective layer via a gap filled with a gas, the first electrode is provided between the first substrate and the organic light emitting layer, and the reflective layer is provided between the second substrate and an optical layer, one end portion side of the sealing unit is provided around the rim of the first substrate and the one other end portion side of the sealing unit is provided around the rim of the first substrate, the gas is filled into the space defined by the first substrate and the second substrate and the sealing unit.

16. The device according to claim 15, wherein the second electrode has a first portion and a second portion, a refractive index of the second portion being different from a refractive index of the first portion.

17. The device according to claim 15, wherein the second electrode includes a co-deposited film of an insulator and at least one species selected from the group consisting of Ag, Au, Ca, and an alkaline metal, or a co-deposited film of an insulator and an alloy including the at least one species selected from the group.

18. The device according to claim 15, wherein the second electrode includes an alloy including at least one species selected from the group consisting of Ag, Au, Ca, and an alkaline metal.

19. The device according to claim 15, wherein the second electrode includes a magnesium-silver alloy, the volume fraction of Ag in the magnesium-silver alloy being not less than 0.2.

* * * * *